(12) United States Patent
Tanaka et al.

(10) Patent No.: US 9,892,857 B2
(45) Date of Patent: Feb. 13, 2018

(54) CAPACITOR CIRCUIT, CIRCUIT DEVICE, PHYSICAL QUANTITY DETECTING DEVICE, ELECTRONIC APPARATUS, AND MOVING OBJECT

(71) Applicant: Seiko Epson Corporation, Tokyo (JP)

(72) Inventors: Atsushi Tanaka, Tatsuno (JP); Hideo Haneda, Matsumoto (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 15/617,292

(22) Filed: Jun. 8, 2017

(65) Prior Publication Data

US 2017/0365414 A1  Dec. 21, 2017

(30) Foreign Application Priority Data

Jun. 15, 2016 (JP) .................. 2016-118443

(51) Int. Cl.
| | |
|---|---|
| H03M 3/00 | (2006.01) |
| H01G 4/40 | (2006.01) |
| H03M 1/12 | (2006.01) |
| H03M 1/38 | (2006.01) |
| H03M 1/00 | (2006.01) |
| G01D 5/56 | (2006.01) |

(52) U.S. Cl.
CPC ............... *H01G 4/40* (2013.01); *G01D 5/56* (2013.01); *H03M 1/001* (2013.01); *H03M 1/1245* (2013.01); *H03M 1/38* (2013.01)

(58) Field of Classification Search
CPC .......... H01G 4/40; G01D 5/56; H03M 1/001; H03M 1/1245; H03M 1/38; H03M 1/12; H03M 1/804; H03M 1/806
USPC .................................. 341/163, 172
See application file for complete search history.

(56) References Cited

U.S. PATENT DOCUMENTS 9,083,371 B2 * 7/2015 Aruga ............... H01G 4/38

FOREIGN PATENT DOCUMENTS

JP    2005-136055 A    5/2005

* cited by examiner

*Primary Examiner* — Khai M Nguyen
(74) *Attorney, Agent, or Firm* — Harness, Dickey & Pierce, P.L.C.

(57) ABSTRACT

A capacitor circuit includes: a capacitor array including a plurality of capacitors; a switch array including a plurality of switch circuits, the switch circuits being respectively connected to the capacitors of the capacitor array; a plurality of switch control signal lines supplied with a plurality of switch control signals; and a substrate having a major surface on which the switch circuits are formed. At least part of the capacitors of the capacitor array is formed of a first conductive layer. The switch control signal lines are formed of a second conductive layer provided between the major surface and the first conductive layer. The capacitor array and the switch array are disposed so as to overlap each other at least in part in a plan view when viewed in a normal direction of the major surface.

20 Claims, 16 Drawing Sheets

CAPACITOR CIRCUIT, CIRCUIT DEVICE, PHYSICAL QUANTITY DETECTING DEVICE, ELECTRONIC APPARATUS, AND MOVING OBJECT

BACKGROUND

1. Technical Field

The present invention relates to a capacitor circuit, a circuit device, a physical quantity detecting device, an electronic apparatus, a moving object, and the like.

2. Related Art

A circuit device including a capacitor circuit configured of a plurality of capacitors and a plurality of switch circuits has been known. The related art of the circuit device includes, for example, one disclosed in JP-A-2005-136055. The circuit device in the related art includes a switched capacitor circuit including a plurality of capacitors, in which all of the capacitors for which relative accuracy is required are disposed in the same island separated from surrounding regions. The peripheral structures of unit capacitors constituting a unit capacitor group are made the same and the unit capacitors constituting all of the capacitors for which relative accuracy is required are disposed at least line-symmetrically or point-symmetrically in the island, so that a delta-sigma type A/D conversion circuit is realized.

For the circuit device including such a capacitor circuit, there is a demand to reduce the size of the circuit area. For example, a successive approximation type A/D conversion circuit or the like using the capacitor circuit has a problem in that a layout configuration or signal wiring is complicated and thus results in an increase in circuit area. For example, there is a problem in that it is difficult to realize both the small area of a circuit and high performance (high resolution or high accuracy) of the circuit.

SUMMARY

An advantage of some aspects of the invention is to provide a capacitor circuit, a circuit device, a physical quantity detecting device, an electronic apparatus, a moving object, and the like, which can realize the small area and high performance of a circuit.

The invention can be implemented as the following modes or aspects.

An aspect of the invention relates to a capacitor circuit including: a capacitor array including a plurality of capacitors; a switch array including a plurality of switch circuits, the plurality of switch circuits being respectively connected to the plurality of capacitors; a plurality of switch control signal lines supplied with a plurality of switch control signals for respectively performing switch-control of the plurality of switch circuits; and a substrate having a major surface on which the plurality of switch circuits are formed. At least part of the plurality of capacitors is formed of a first conductive layer formed above the major surface of the substrate, and the plurality of switch control signal lines are formed of a second conductive layer provided between the major surface of the substrate and the first conductive layer. The capacitor array and the switch array are disposed so as to overlap each other at least in part in a plan view when viewed in a normal direction of the major surface of the substrate.

In the aspect of the invention, the capacitor circuit includes: a capacitor array including a plurality of capacitors; a switch array including a plurality of switch circuits, the plurality of switch circuits being respectively connected to the plurality of capacitors; a plurality of switch control signal lines supplied with a plurality of switch control signals for respectively performing switch-control of the plurality of switch circuits; and a substrate having a major surface on which the plurality of switch circuits are formed. At least part of the plurality of capacitors is formed of a first conductive layer formed above the major surface of the substrate, and the plurality of switch control signal lines are formed of a second conductive layer provided between the major surface of the substrate and the first conductive layer. The capacitor array and the switch array are disposed so as to overlap each other at least in part in a plan view when viewed in a normal direction of the major surface of the substrate. By doing so, for example, the capacitor array and the switch array are disposed so as to overlap each other in a plan view, the switch control signal lines are wired between the capacitor array and the switch array, and thus, a reduction in circuit area can be achieved. Moreover, by wiring the switch control signal lines between the capacitor array and the switch array, a further reduction in circuit area or high performance of a circuit can be realized.

In the aspect of the invention, the plurality of switch control signal lines may be wired along a first direction in the plan view.

With this configuration, the plurality of switch control signal lines can be, for example, evenly and uniformly wired along the first direction, and high performance or the like of a circuit can be realized.

In the aspect of the invention, the plurality of capacitors may include first to n-th (n is an integer of 2 or more) capacitors disposed along the first direction in the plan view, the plurality of switch circuits may include first to n-th switch circuits disposed along the first direction in the plan view, the plurality of switch control signal lines may include first to n-th switch control signal lines for performing switch-control of the first to n-th switch circuits, an i-th (i is an integer of from 1 to n) capacitor of the first to n-th capacitors may be connected to the i-th switch circuit of the first to n-th switch circuits, and the i-th switch control signal line of the first to n-th switch control signal lines may be wired along the first direction so as to overlap the i-th capacitor of the first to n-th capacitors in the plan view.

With this configuration, the first to n-th switch control signal lines of the first to n-th switch circuits corresponding to the first to n-th capacitors are wired along the first direction so as to overlap the first to n-th capacitors in the plan view. Thus, the first to n-th switch control signal lines can be evenly and uniformly wired below the first to n-th capacitors, and the small area or high performance of a circuit can be realized.

In the aspect of the invention, the i-th switch control signal line of the first to n-th switch control signal lines may be connected to the i-th switch circuit of the first to n-th switch circuits, and the first to n-th switch control signal lines may be wired so as to overlap the first to n-th capacitors in the plan view.

With this configuration, the i-th switch control signal line, which is only required originally to be wired to the connection point with the i-th switch circuit, is also wired below the i-th+1 to n-th capacitors beyond the connection point. With this configuration, for example, the uniformity of flatness in the first to n-th capacitors can be achieved, and an improvement in capacitance relative accuracy or the like can be achieved.

In the aspect of the invention, the capacitor circuit may further include a plurality of voltage supply lines for supplying voltages to each of the plurality of switch circuits, and the plurality of voltage supply lines may be wired along a second direction crossing the first direction so as to overlap the capacitor array in the plan view.

With this configuration, the switch control signal lines are wired along the first direction, and the voltage supply lines to the switch circuits are wired along the second direction crossing the first direction. Therefore, efficient layout wiring can be realized, and a further reduction in circuit area can be achieved.

An aspect of the invention relates to a circuit device including: the capacitor circuit according to the above; and a control circuit outputting the switch control signals.

With this configuration, the switch-control of the switch circuits of the switch array can be realized by the switch control signals from the control circuit.

In the aspect of the invention, the capacitor array and the control circuit may be disposed along the first direction in the plan view.

With this configuration, the switch control signal lines from the control circuit can be connected in a short path to the switch circuits below the capacitors of the capacitor array, and an efficient layout arrangement can be realized.

In the aspect of the invention, the circuit device may further include a voltage generating circuit generating voltages, the capacitor array may include a first capacitor array and a second capacitor array, the switch array may include a first switch array connected to the first capacitor array and a second switch array connected to the second capacitor array, and the voltages from the voltage generating circuit may be supplied to the switch circuits of the second switch array.

With this configuration, the voltages from the voltage generating circuit can be supplied to one ends of the capacitors via the switch circuits, and high performance or the like of a circuit can be achieved.

In the aspect of the invention, the plurality of switch control signal lines may be wired along a first direction in the plan view, the second capacitor array may be disposed between the voltage generating circuit and the first capacitor array in the plan view, and a plurality of voltage supply lines for supplying the voltages from the voltage generating circuit to the switch circuits of the second switch array may be wired along a second direction crossing the first direction in the plan view.

With this configuration, the voltages from the voltage generating circuit can be supplied through the voltage supply lines in a short path to the switch circuits of the second switch array corresponding to the second capacitor array, and high performance or the like of a circuit can be achieved.

In the aspect of the invention, the first capacitor array may deal with high-order bit-side A/D conversion in A/D conversion, the second capacitor array may deal with low-order bit-side A/D conversion in A/D conversion, an input voltage to be subjected to A/D conversion, a high-potential side reference voltage, and a low-potential side reference voltage may be supplied to the switch circuits of the first switch array, and a plurality of voltage supply lines for supplying the input voltage, the high-potential side reference voltage, and the low-potential side reference voltage to the switch circuits of the first switch array may be wired along a second direction crossing the first direction in the plan view.

With this configuration, the voltage supply lines of the input voltage, the high-potential side reference voltage, and the low-potential side reference voltage can be efficiently wired to the first switch array on the high-order bit side.

In the aspect of the invention, the circuit device may further include a comparator circuit connected at a comparison node with the capacitor array, and a D/A conversion circuit including the capacitor array and the switch array and performing charge redistribution type D/A conversion, and the control circuit may generate the switch control signals based on a comparison result of the comparator circuit, and output the switch control signals to the switch array.

With this configuration, in an A/D conversion circuit including a charge redistribution type D/A conversion circuit, the small area or high performance of the circuit can be realized.

In the aspect of the invention, the plurality of switch control signal lines may be wired along a first direction in the plan view, and the comparator circuit and the control circuit may be disposed along the first direction in the plan view.

With this configuration, the control circuit, the comparator circuit, and the capacitor array can be efficiently laid out and disposed, and efficient layout wiring, a reduction in circuit area, or the like can be achieved.

Another aspect of the invention relates to a physical quantity detecting device including: a physical quantity transducer; and the circuit device according to the above, which detects a physical quantity based on a detection signal from the physical quantity transducer.

Another aspect of the invention relates to an electronic apparatus including the circuit device according to the above.

Another aspect of the invention relates to a moving object including the circuit device according to the above.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of the invention will be described in detail. The embodiments described below do not unduly limit the details of the invention set forth in the appended claims. Not all of the configurations described in the embodiments may necessarily be indispensable as solving means of the invention.

1. Capacitor Circuit

Figure 1:
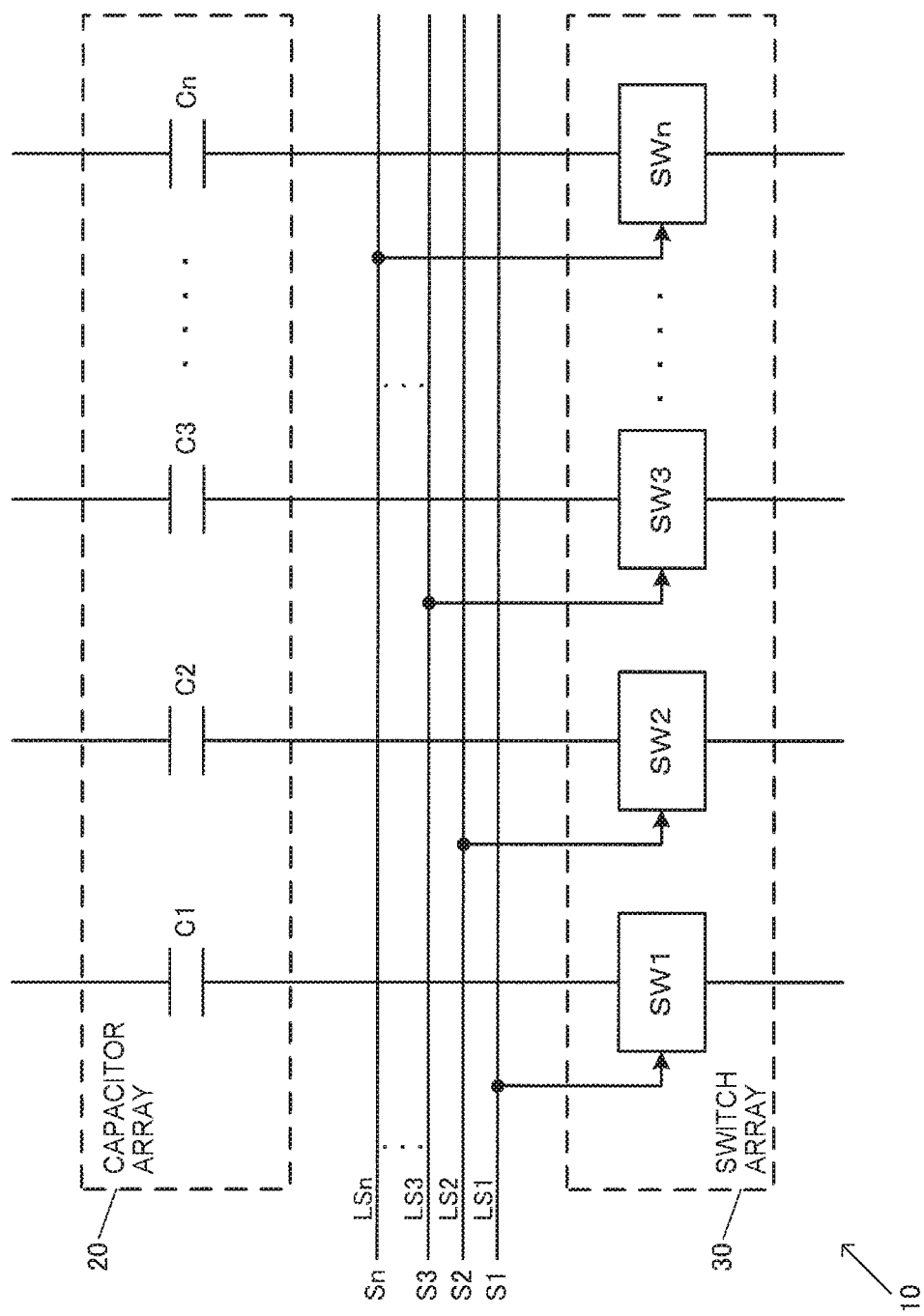
FIG. 1 shows a configuration example of a capacitor circuit of an embodiment.

FIG. 1 shows a configuration example of a capacitor circuit 10 of an embodiment. The capacitor circuit 10 includes a capacitor array 20 including a plurality of capacitors C1 to Cn (n is an integer of 2 or more), and a switch array 30 including a plurality of switch circuits SW1 to SWn (switch elements). For example, in the switch circuits SW1 to SWn, the switch circuits are connected to the capacitors C1 to Cn of the capacitor array 20. For example, the switch circuit SW1 is connected to one end of the capacitor C1, and the switch circuit SW2 is connected to one end of the capacitor C2. The same applies to the connection configurations between the capacitors C3 to Cn and the switch circuits SW3 to SWn.

The capacitor circuit 10 includes a plurality of switch control signal lines LS1 to LSn. The switch control signal lines LS1 to LSn are signal lines supplied with switch control signals S1 to Sn for performing switch-control of the switch circuits SW1 to SWn. For example, the switch circuit SW1 is switch-controlled (on/off-controlled) by the switch control signal S1, and the switch circuit SW2 is switch-controlled by the switch control signal S2. Similarly, the switch circuits SW3 to SWn are switch-controlled by the switch control signals S3 to Sn. The capacitor circuit 10 of the embodiment is not limited to the configuration in FIG. 1, and it is possible to implement various modifications such as omitting a portion of the components of the configuration, adding another component, or changing the connection relationship.

In the embodiment, the capacitors C1 to Cn of the capacitor array 20 are formed of at least one metal layer (in a broad sense, a conductive layer). For example, the capacitors C1 to Cn are formed of two metal layers (conductive layers) or one metal layer (conductive layer). The switch control signal lines LS1 to LSn are formed of, for example, a metal layer (conductive layer) below the metal layer forming the capacitors C1 to Cn. In addition, the switch control signal lines LS1 to LSn are formed of the metal layer provided between the capacitor array 20 and the switch array 30 in a cross-sectional view. For example, the switch control signal lines LS1 to LSn are wired (disposed) between the capacitor array 20 and the switch array 30 in the cross-sectional view. Specifically, the switch control signal lines LS1 to LSn are formed of the metal layer provided between the capacitor array 20 and the switch array 30 in a cross-sectional view when viewed in a direction parallel (substantially parallel) to the major surface of a substrate on which the switch circuits SW1 to SWn of the switch array 30 are formed.

Figure 2:
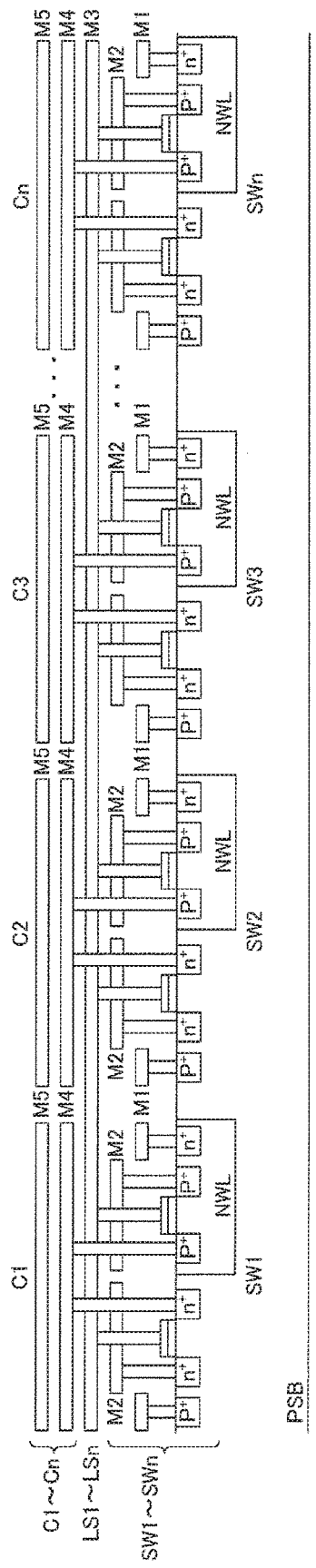
FIG. 2 is a cross-sectional view of the capacitor circuit.

For example, FIG. 2 shows one example of a cross-sectional view of the capacitor circuit 10 of the embodiment. FIG. 2 is a cross-sectional view in a cross-sectional view (cross-sectional view in a second direction DR2) when viewed in a direction parallel to the major surface of a substrate PSB (e.g., a P-type semiconductor substrate). The switch circuits SW1 to SWn (transistors constituting the switch circuits) are formed on the substrate PSB.

For example, the capacitors C1 to Cn are formed of a metal layer M5 (metal layer in a fifth layer) and a metal layer M4 (metal layer in a fourth layer). For example, the capacitors C1 to Cn can be realized by capacitors having a metal-insulator-metal (MIM) structure shown in FIG. 5 to be described later. However, the capacitors C1 to Cn may be realized by one metal layer shown in FIG. 6 to be described later.

The switch circuits SW1 to SWn are realized by N-type and P-type transistors (MOS transistors). In FIG. 2, the N-type transistor is realized by a drain and a source, each of which is composed of an N-type diffusion region (impurity region) formed on the substrate PSB of P-type, a gate electrode, and a gate insulating film. The P-type transistor is realized by a drain and a source, each of which is composed of a P-type diffusion region (impurity region) formed in an N-type well NWL on the substrate PSB, a gate electrode, and a gate insulating film. The switch circuits SW1 to SWn are realized by the N-type and P-type transistors and wiring lines formed of a metal layer M1 (metal layer in a first layer) and a metal layer M2 (metal layer in a second layer). A potential (VDD) of the substrate PSB of P-type is set by a P-type diffusion region, and a potential (GND) of the N-type well NWL is set by an N-type diffusion region. Power supplies (VDD, GND) for potential setting are supplied to the P-type and N-type diffusion regions through the wiring lines of the metal layer M1.

In the embodiment as shown in FIG. 2, the switch control signal lines LS1 to LSn for supplying the switch control signals S1 to Sn to the switch circuits SW1 to SWn are formed of a metal layer M3 (metal layer in a third layer) below (on the substrate PSB side) the metal layers M4 and M5 forming the capacitors C1 to Cn. The switch control signal lines LS1 to LSn are formed of the metal layer provided between the capacitor array 20 (the capacitors C1 to Cn) and the switch array 30 (the switch circuits SW1 to SWn) in the cross-sectional view of FIG. 2. That is, the switch control signal lines LS1 to LSn are wired below (below in the cross-sectional view) the capacitor array 20 (the metal layers constituting the capacitors) and above (above in the cross-sectional view) the switch array 30 (the transistors, etc. constituting the switch circuits).

Figure 3:
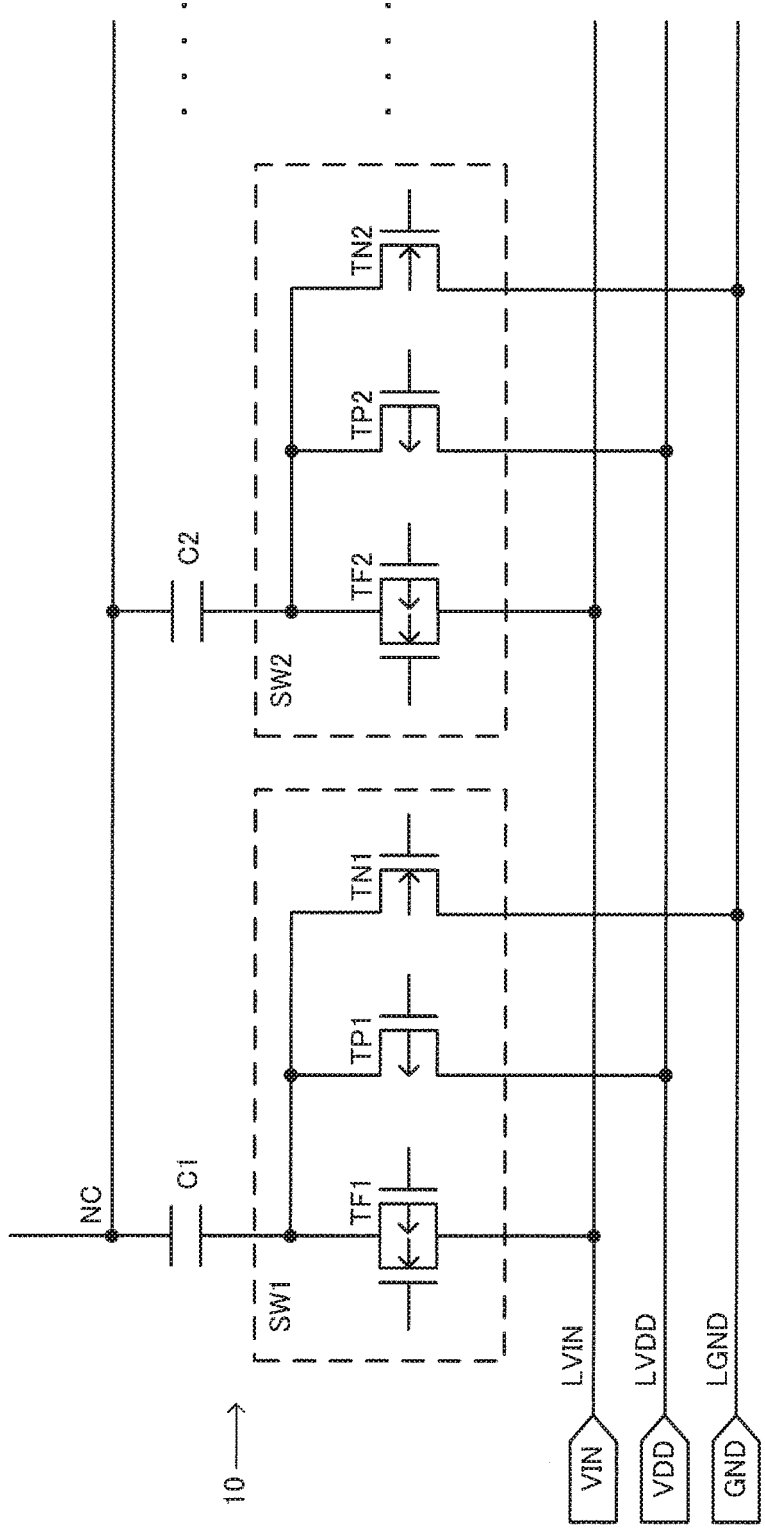
FIG. 3 shows a detailed configuration example of the capacitor circuit.
Figure 4:
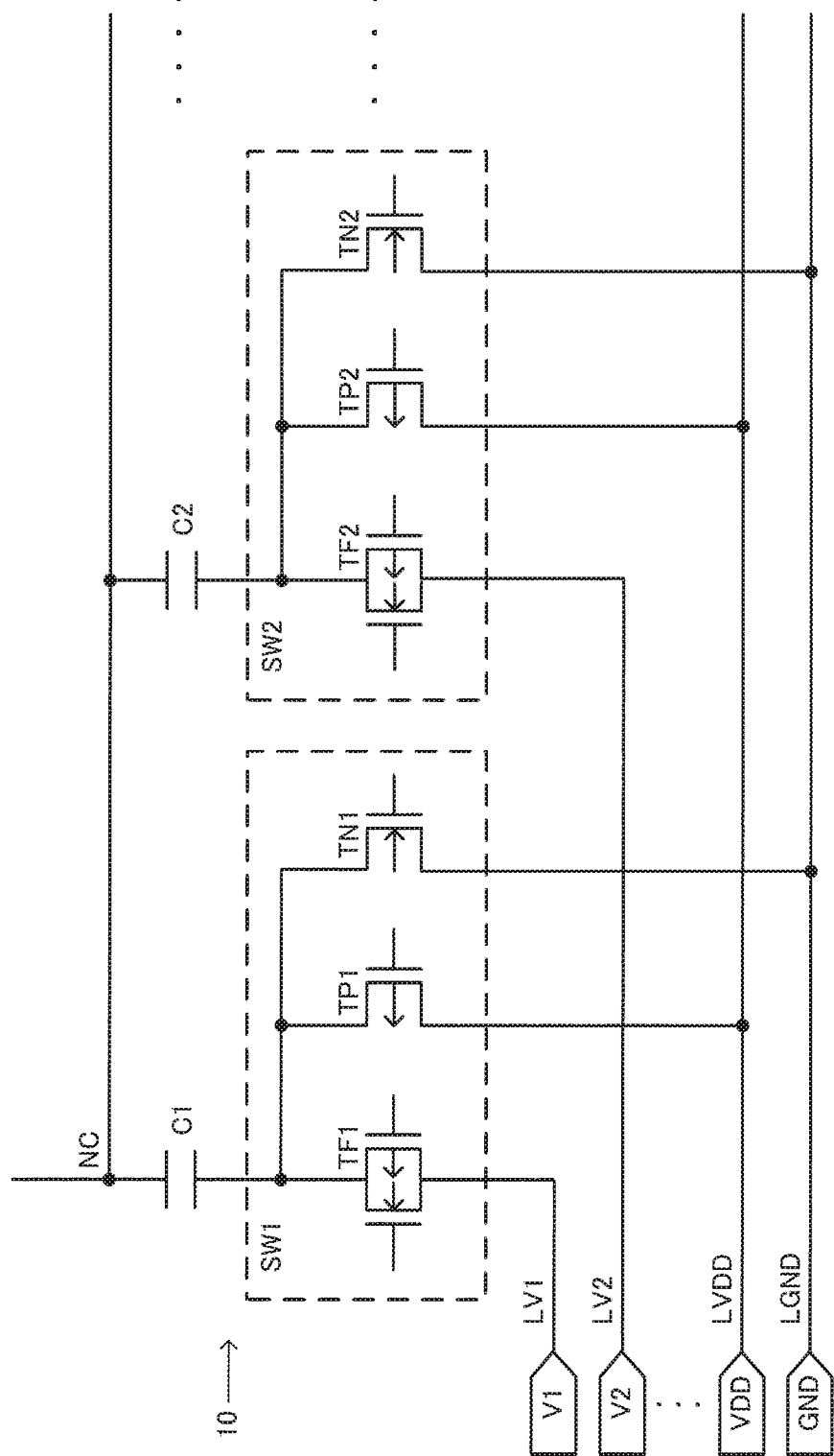
FIG. 4 shows a detailed configuration example of the capacitor circuit.

FIGS. 3 and 4 each show a detailed configuration example of the capacitor circuit 10. FIG. 3 shows a configuration example of the capacitor circuit 10 used in a D/A converter DAC1 (DAC1P, DAC1N) on the MSB side (high-order bit side) in FIGS. 10 to 12 to be described later. FIG. 4 shows a configuration example of the capacitor circuit 10 used in a D/A converter DAC2 (DAC2P, DAC2N) on the LSB side (low-order bit side). The capacitor circuit 10 of the embodiment is not limited to the configurations in FIGS. 3 and 4, and it is possible to implement various modifications such as omitting a portion of the components of the configuration, adding another component, or changing the connection relationship.

The other ends of the capacitor C1, C2, . . . are connected to a node NC (sampling node) in FIG. 3. The switch circuit SW1 is configured of a transfer gate TF1 (CMOS analog switch), a P-type transistor TP1, and an N-type transistor TN1. The switch circuit SW2 is configured of a transfer gate TF2, a P-type transistor TP2, and an N-type transistor TN2.

One ends (one of the drains and sources) of the transfer gate TF1 and the transistors TP1 and TN1 of the switch circuit SW1 are connected to one end of the capacitor C1. The other ends (the other of the drains and sources) of the transfer gate TF1 and the transistors TP1 and TN1 are respectively connected to voltage supply lines LVIN, LVDD, and LGND. An input voltage VIN, a reference voltage VDD on the high-potential side, and a reference voltage GND on the low-potential side are supplied to the voltage supply lines LVIN, LVDD, and LGND. The switch control signal S1 in FIG. 1 or a signal based on S1 (e.g., a signal obtained by buffering S1, an inversion signal of S1, etc.) is input to the gates of the transfer gate TF1 and the transistors TP1 and TN1 to control the turning on or off of the transfer gate TF1 and the transistors TP1 and TN1. With this configuration, VIN, VDD, or GND can be supplied to one end of the capacitor C1.

One ends of the transfer gate TF2 and the transistors TP2 and TN2 of the switch circuit SW2 are connected to one end of the capacitor C2. The other ends of the transfer gate TF2 and the transistors TP2 and TN2 are respectively connected to the voltage supply lines LVIN, LVDD, and LGND. The switch control signal S2 in FIG. 1 or a signal based on S2 (e.g., a signal obtained by buffering S2, an inversion signal of S2, etc.) is input to the gates of the transfer gate TF2 and the transistors TP2 and TN2 to control the turning on or off of the transfer gate TF2 and the transistors TP2 and TN2. With this configuration, VIN, VDD, or GND can be supplied to one end of the capacitor C2.

The switch circuits SW1 and SW2 may include, in addition to the transfer gates TF1 and TF2 and the transistors TP1, TP2, TN1, and TN2, for example a logic circuit or the like required for the generation of the inversion signal of the switch control signal, or the like.

FIG. 4 is different from FIG. 3 in the voltages to be supplied to the other ends of the transfer gates TF1 and TF2. That is, a voltage supply line LV1 is connected to the other end of the transfer gate TF1, and a voltage V1 is supplied thereto. A voltage supply line LV2 is connected to the other end of the transfer gate TF2, and a voltage V2 is supplied thereto. The voltages V1 and V2 are, for example, voltages (reference voltages) that are generated by a voltage generating circuit 60 in FIGS. 10 and 11 to be described later. The voltages V1 and V2 and the like are, for example, voltages that are binary-weighted (weighted by powers of 2).

Figure 10:
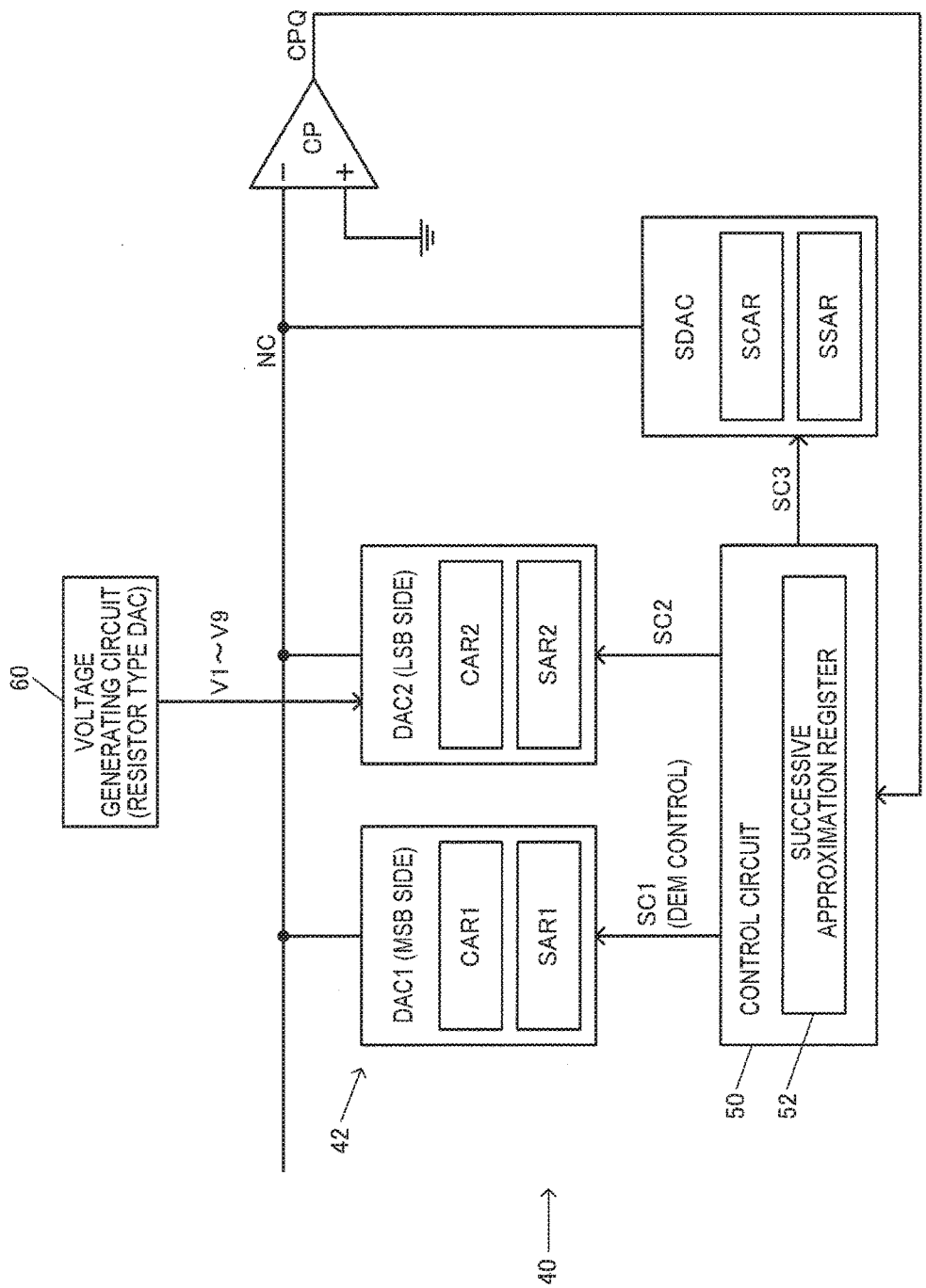
FIG. 10 shows a configuration example of an A/D conversion circuit as a circuit device of an embodiment.
Figure 11:
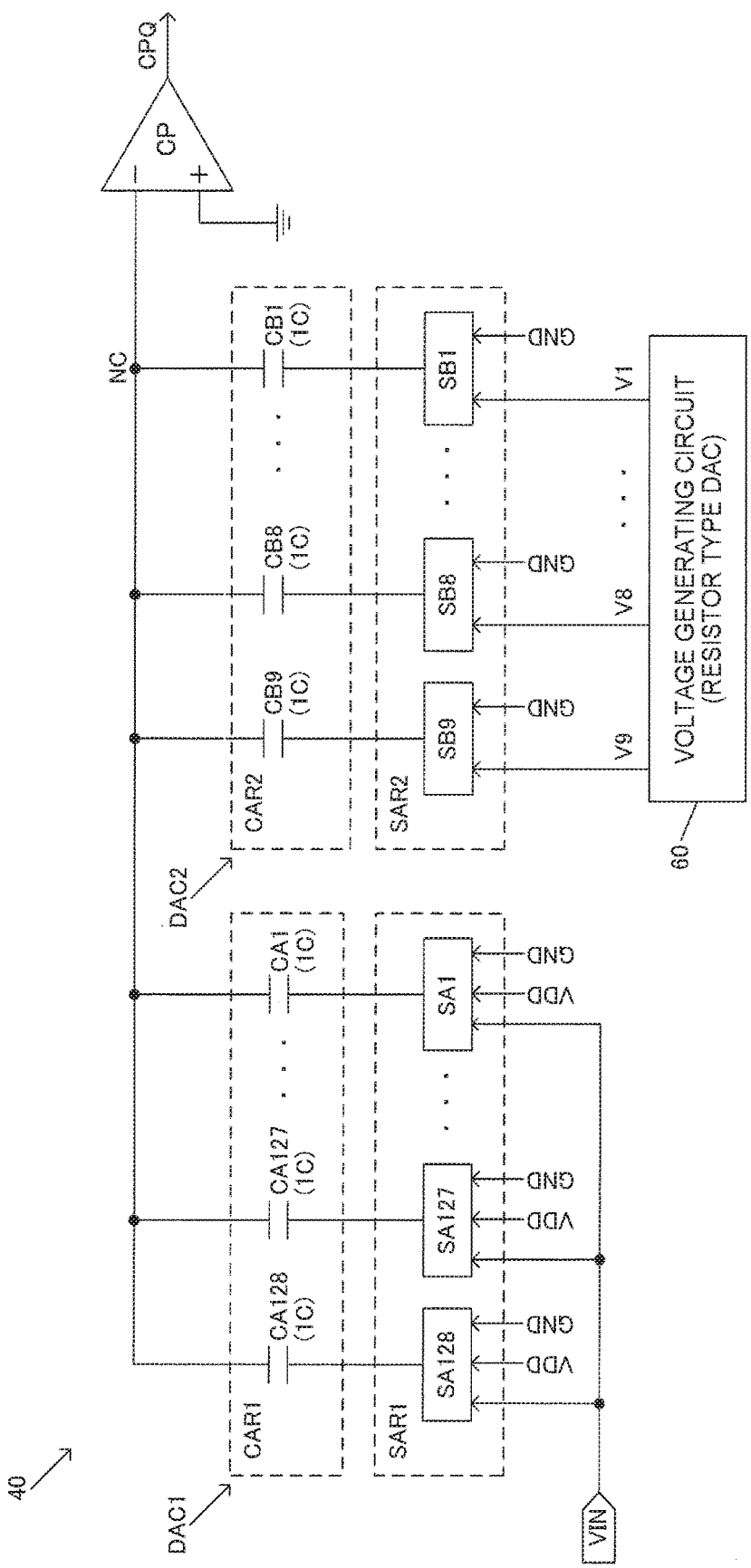
FIG. 11 shows a detailed configuration example of the A/D conversion circuit.
Figure 12:
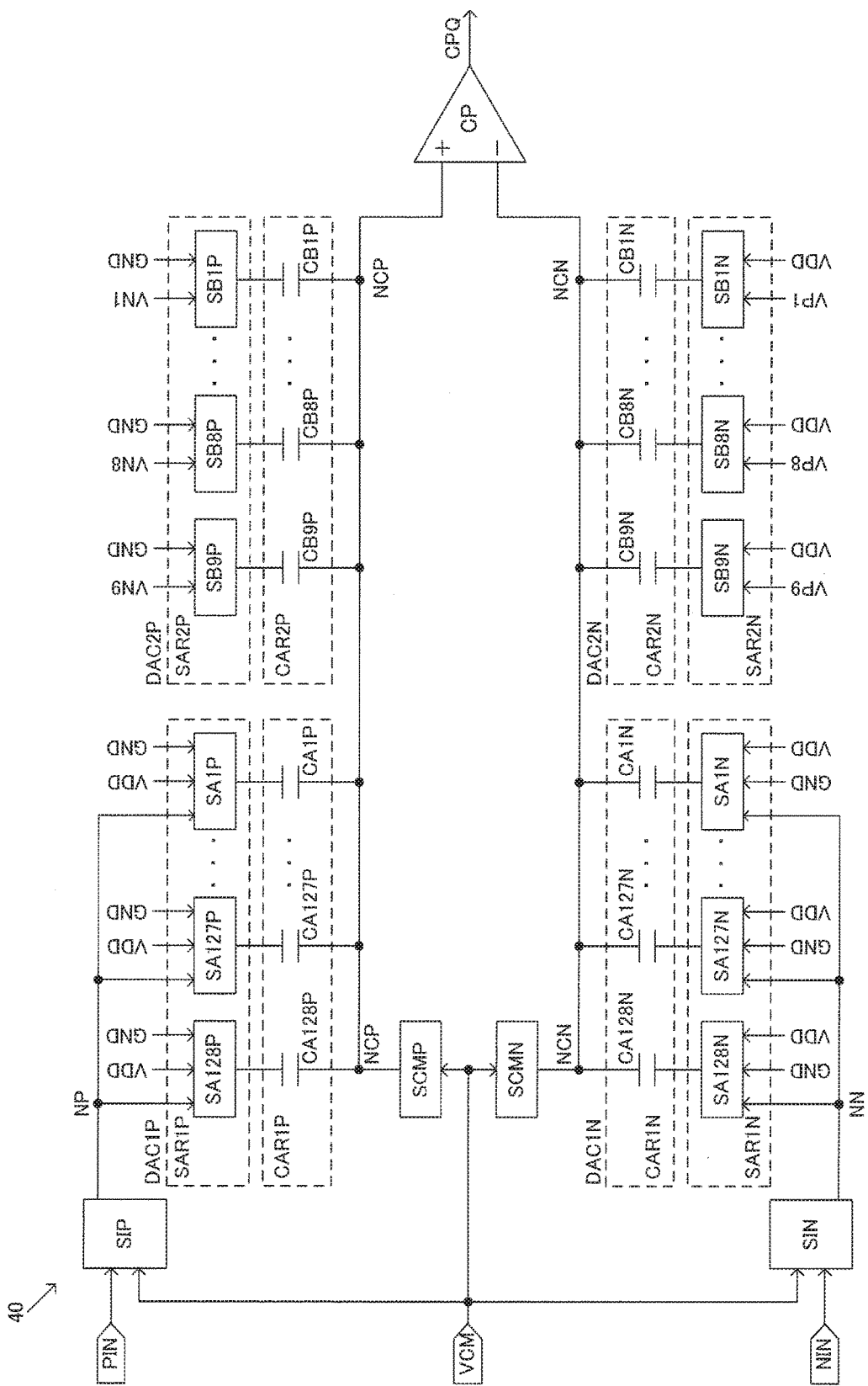
FIG. 12 shows a detailed configuration example of a fully differential A/D conversion circuit.

In the case of using the capacitor circuit 10 in FIG. 4 for the D/A converter DAC2 on the LSB side in FIGS. 10 to 12, only one of the transistors TP1 and TN1 is used in the switch circuit SW1 while the other is a dummy transistor. Only one of the transistors TP2 and TN2 is used in the switch circuit SW2 while the other is a dummy transistor. By providing the dummy transistors, the flatness of the capacitor array 20 can be maintained, and capacitance relative accuracy can be improved.

Figure 5:
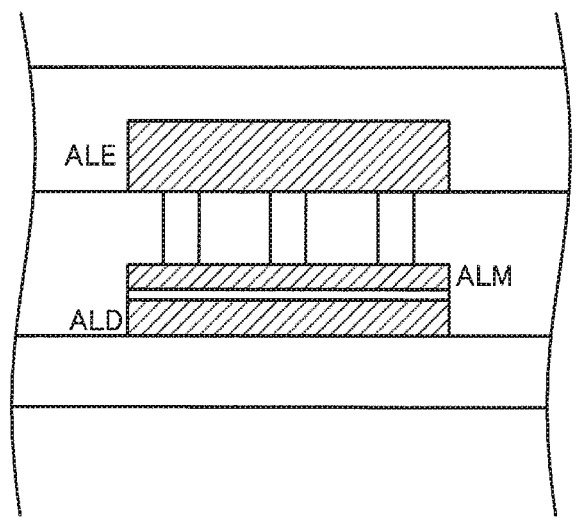
FIG. 5 shows one example of a capacitor structure.
Figure 6:
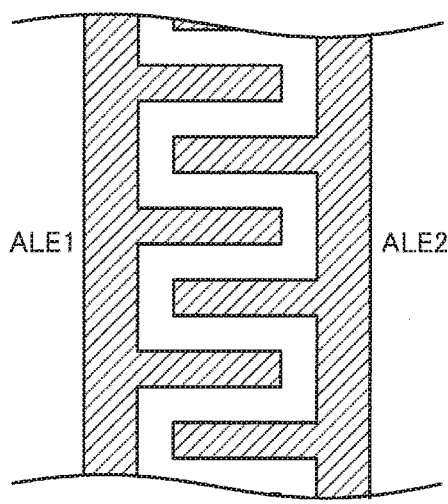
FIG. 6 shows another example of the capacitor structure.

FIGS. 5 and 6 each show a structure example of the capacitors C1 to Cn. The capacitor in FIG. 5 is a capacitor having a metal-insulator-metal (MIM) structure. An intermediate metal layer ALM is formed in an inter-layer insulating film between an upper metal layer ALE and a lower metal layer ALD. The metal layers ALD and ALE are, for example, aluminum layers. The capacitor having the MIM structure is realized by the metal layer ALM (e.g., the metal layer M5 in FIG. 2), the metal layer ALD (e.g., the metal layer M4) and the inter-layer insulating film between the metal layers ALM and ALD.

In FIG. 6, a capacitor is realized by wiring lines ALE1 and ALE2 formed of one metal layer (e.g., the metal layer M5 in FIG. 2). For example in FIG. 6, the wiring lines ALE1 and ALE2 are formed in a so-called comb-teeth shape, in which a projecting portion of one of the wiring lines ALE1 and ALE2 is disposed so as to enter a recessed portion of the other, so that the capacitor is realized by the inter-wiring capacitance (inter-wiring capacitance in the direction parallel to the major surface of the substrate) between the wiring lines ALE1 and ALE2. The metal layer forming the wiring lines ALE1 and ALE2 is desirably a metal layer (e.g., the metal layer M5 in FIG. 2) having a thick film thickness, a so-called top metal.

The capacitor is not limited to the structures in FIGS. 5 and 6. Various modifications can be implemented as long as the capacitor is configured of at least one metal layer (conductive layer).

Figure 7:
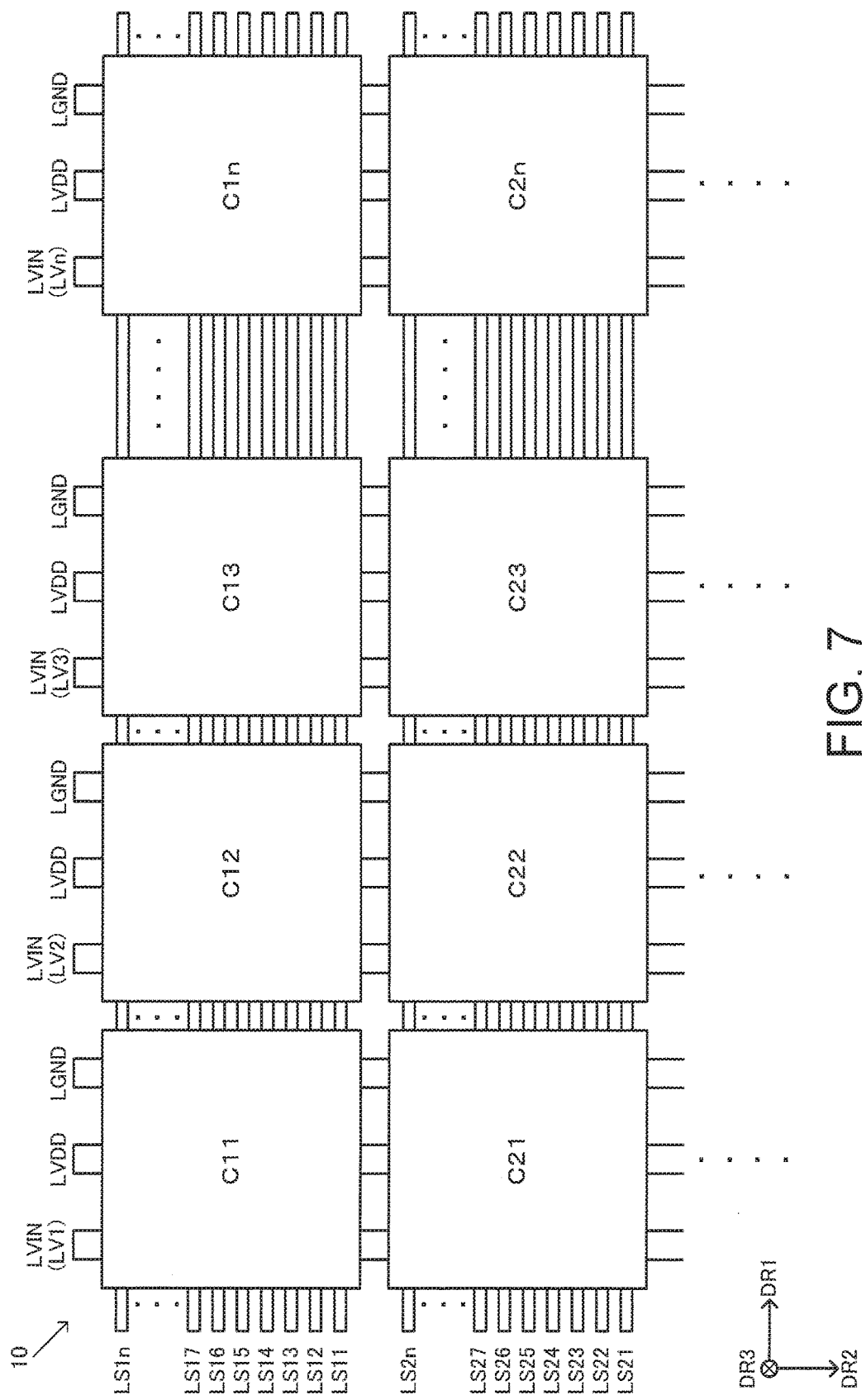
FIG. 7 is a plan view of the capacitor circuit.

FIG. 7 is an example of a plan view of the capacitor circuit 10. FIG. 7 is a plan view in a plan view when the capacitor circuit 10 is viewed in a direction (third direction DR3) crossing (orthogonal to) the substrate PSB in FIG. 2. In FIG. 7, capacitors C11, C12, . . . , and C1$n$ and C21, C22, . . . , and C2$n$ are arranged in a matrix. The arrangement of the capacitors in the capacitor array 20 may be a two-dimensional array arrangement as in FIG. 7, or may be a one-dimensional array arrangement. The capacitors C11 to C1$n$ and C21 to C2$n$ can be realized by, for example, unit capacitors (unit capacitances) whose areas are equal to each other and whose capacitance values are equal to each other.

In the embodiment as shown in FIG. 7, a plurality of switch control signal lines LS11 to LS1$n$ and LS21 to LS2$n$ are wired along a first direction DR1 in a plan view when viewed in the direction (the third direction DR3) crossing the substrate PSB.

The first direction DR1 is a direction parallel (substantially parallel) to the major surface of the substrate PSB. The capacitors C11 to C1$n$ are disposed along the first direction DR1. The capacitors C21 to C2$n$ are also disposed along the first direction DR1. The switch control signal lines LS11 to LS1$n$ are wired so as to overlap the capacitors C11 to C1$n$ in the plan view. The switch control signal lines LS21 to LS2$n$ are wired so as to overlap the capacitors C21 to C2$n$ in the plan view. More specifically, in the cross-sectional view of FIG. 2, the switch control signal lines LS11 to LS1$n$ are wired between the capacitors C11 to C1$n$ and switch circuits SW11 to SW1$n$ (see FIG. 8) below the capacitors C11 to C1$n$. The switch control signal lines LS21 to LS2$n$ are wired between the capacitors C21 to C2$n$ and switch circuits SW21 to SW2$n$ (not shown) below the capacitors C21 to C2$n$ in the cross-sectional view of FIG. 2.

The switch control signal lines LS11 to LS1$n$ and LS21 to LS2$n$ correspond to the switch control signal lines LS1 to LSn in FIGS. 1 and 2, and are signal lines for switch-controlling the switch circuits SW1 to SWn. The turning on or off of the transfer gates TF1 and TF2 and the transistors TP1, TP2, TN1, and TN2 in FIGS. 3 and 4 are controlled using the switch control signal lines LS1 to LSn (LS11 to LS1$n$, LS21 to LS2$n$). With this configuration, each of the corresponding voltages (LVIN, VDD, GND, V1, V2, etc.) can be supplied to one end of the capacitor.

Moreover, as shown in FIG. 7, the voltage supply lines LVIN (or LV1 to LVn), LVDD, and LGND are wired along the second direction DR2 crossing (orthogonal to) the first direction DR1. For example in FIG. 3, the voltage supply lines LVIN, LVDD, and LGND are respectively connected to the other ends of the transfer gate TF1 and TF2, the transistors TP1 and TP2, and the transistors TN1 and TN2.

Moreover, in FIG. 4, the voltage supply lines LV1 and LV2 are respectively connected to the other ends of the transfer gates TF1 and TF2, and the voltage supply lines LVDD and LGND are respectively connected to the other ends of the transistors TP1 and TP2 and the transistors TN1 and TN2.

For example in the capacitor circuit 10 in FIG. 7, the capacitor array 20 in FIG. 1 includes the capacitors C11 to C1n (in a broad sense, first to n-th capacitors; n is an integer of 2 or more) disposed along the first direction DR1 in the plan view. Moreover, the switch array 30 includes the switch circuits SW11 to SW1n (in a broad sense, first to n-th switch circuits; see FIG. 8), which are respectively connected to the capacitors C11 to C1n (one ends of the capacitors) and disposed along the first direction DR1 in the plan view. The switch control signal lines of the capacitor circuit 10 include the switch control signal lines LS11 to LS1n (in abroad sense, first to n-th switch control signal lines) for switch-controlling the switch circuits SW11 to SW1n.

The switch control signal lines LS11 to LS1n are wired along the first direction DR1 so as to overlap the capacitors C11 to C1n in the plan view. That is, as described with reference to FIG. 2, the switch control signal lines LS11 to LS1n (LS1 to LSn) are wired along the first direction DR1 in the layer below the capacitors C11 to C1n (C1 to Cn) (in the layer above the switch circuits).

Similarly, the capacitor array 20 includes the capacitors C21 to C2n (first to n-th capacitors) disposed along the first direction DR1 in the plan view. The switch array 30 includes the switch circuits SW21 to SW2n (first to n-th switch circuits; not shown), which are respectively connected to the capacitors C21 to C2n (one ends of the capacitors) and disposed along the first direction DR1 in the plan view. The switch control signal lines of the capacitor circuit 10 include the switch control signal lines LS21 to LS2n (first to n-th switch control signal lines) for switch-controlling the switch circuits SW21 to SW2n. The switch control signal lines LS21 to LS2n are wired along the first direction DR1 so as to overlap the capacitors C21 to C2n in the plan view.

The switch control signal line LS11 (in a broad sense, the i-th switch control signal line; i is an integer of 1 or more and smaller than n) of the switch control signal lines LS11 to LS1n wired below the capacitors C11 to C1n is connected to the switch circuit SW11 (in a broad sense, the i-th switch circuit) of the switch circuits SW11 to SW1n. Similarly, the switch control signal lines LS12, LS13, . . . , and LS1n are respectively connected to the switch circuits SW12, SW13, . . . , and SW1n.

In the embodiment in this case, the switch control signal line LS11 (the i-th switch control signal line) is also wired, beyond the connection point with the switch circuit SW11, below (below in the cross-sectional view) the capacitors C12 to C1n (in a broad sense, the i-th+1 to n-th capacitors). That is, in FIG. 7, the switch control signal line LS11 is wired from the left end portion to the right end portion of the capacitors C11 to C1n. That is, the switch control signal line LS11, which is connected to the switch circuit SW11 below the capacitor C11, is only required originally to be wired to the connection point with the switch circuit SW11; in FIG. 7, however, the switch control signal line LS11 is formed, beyond this connection point, to extend to the right end portion.

Similarly, the switch control signal line LS12 (the i-th switch control signal line) is also wired, beyond the connection point with the switch circuit SW12, below (below in the cross-sectional view) the capacitors C13 to C1n (the i-th+1 to n-th capacitors). That is, the switch control signal line LS12, which is connected to the switch circuit SW12 below the capacitor C12, is only required originally to be wired to the connection point with the switch circuit SW12; in FIG. 7, however, the switch control signal line LS12 is formed, beyond this connection point, to extend to the right end portion. Similarly, the other switch control signal lines LS13 to LS1n, which are wired below the capacitors C11 to C1n, are formed and wired, beyond the connection points with the corresponding switch circuits, to extend to the right end portion of the capacitors C11 to C1n. Moreover, the switch control signal lines LS21 to LS2n, which are wired below the capacitors C21 to C2n, are also formed and wired, beyond the connection points with the corresponding switch circuits, to extend to the right end portion of the capacitors C21 to C2n.

By doing so, the wiring patterns of the switch control signal lines LS11 to LS1n below the capacitors C11 to C1n can be made the same in the capacitors C11 to C1n. Moreover, the wiring patterns of the switch control signal lines LS21 to LS2n below the capacitors C21 to C2n can be made the same in the capacitors C21 to C2n. Thus, the uniformity of flatness in the capacitors can be achieved, and capacitance relative accuracy can be improved. That is, the flatness of the capacitors is deteriorated when the switch control signal lines are wired below the capacitors; however, the degrees of deterioration of flatness are made uniform among the capacitors when the switch control signal lines are evenly and uniformly wired as in FIG. 7. As a result of this, an improvement in capacitance relative accuracy can be achieved.

For example in FIG. 7, it is assumed that the wiring pattern of the switch control signal lines LS11 to LS1n below the capacitor C11 is different from the wiring pattern of the switch control signal lines LS11 to LS1n below the capacitor C1n. If so, the degrees of deterioration of flatness of the capacitors C11 and C1n caused by the switch control signal lines LS11 to LS1n are different from each other, so that the capacitance relative accuracy of C11 and C1n decreases. This decrease in capacitance relative accuracy lowers, for example, the performance of a circuit (e.g., resolution, etc. of an A/D conversion circuit or a D/A conversion circuit) including the capacitor circuit 10.

In contrast, in the embodiment, for example the switch control signal line LS11 connected to the switch circuit SW11 corresponding to the capacitor C11 is formed, beyond the connection point with SW11, to extend to the position of the capacitor C1n. That is, a dummy signal line that is originally unnecessary is wired from the connection point with SW11 to the position of the capacitor C1n. The same applies to the other switch control signal lines LS12, LS13, . . . , and LS1n.

By doing so, in the embodiment, the wiring pattern of the switch control signal lines LS11 to LS1n below the capacitor C11 can be made the same as the wiring pattern of the switch control signal lines LS11 to LS1n below the capacitor C1n. Thus, the degrees of deterioration of flatness of the capacitors C11 and C1n caused by the switch control signal lines LS11 to LS1n can be made uniform. The same applies to the capacitors other than the capacitors C11 and C1n. Thus, the capacitance relative accuracy of the capacitors in the capacitor array 20 can be improved, and an improvement in circuit performance can be achieved.

Moreover, as shown in FIG. 7, the capacitor circuit 10 includes the plurality of voltage supply lines LVIN (LV1 to LVn), LVDD, and LGND for supplying voltages to the switch circuits of the switch array 30. The voltage supply lines LVIN (LV1 to LVn), LVDD, and LGND are wired along the second direction DR2 so as to overlap the capacitor array 20 in the plan view. For example, the voltage supply lines LVIN (LV1 to LVn), LVDD, and LGND in FIG. 7 are wired using the metal layer M2 (metal layer in the second layer) in FIG. 2, and wired below the capacitor array 20 (C1 to Cn). More specifically, the voltage supply lines LVIN (LV1 to LVn), LVDD, and LGND are wired below the switch control signal lines (LS1 to LSn) formed of the metal layer M3 (metal layer in the third layer).

By doing so, it is possible, while performing switch-control of the switch circuits of the switch array 30 using the switch control signal lines LS11 to LS1n and LS2l to LS2n wired along the first direction DR1, to supply various voltages to the other ends of the switch circuits using the voltage supply lines LVIN (LV1 to LVn), LVDD, and LGND wired along the second direction DR2 crossing the first direction DR1. With this configuration, as described with reference to FIGS. 3 and 4, various voltages can be supplied to one end of the capacitor via the switch circuit.

Figure 8:
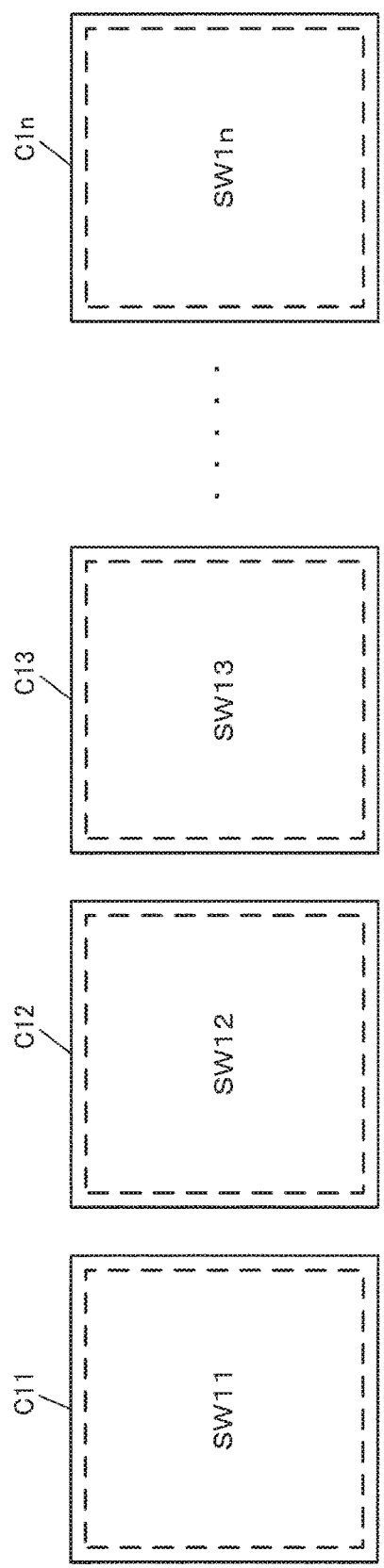
FIG. 8 is an explanatory view of the arrangement relationship between capacitors and switch circuits.

FIG. 8 shows the arrangement relationship between the capacitors C11 to C1n and the switch circuits SW11 to SW1n. The arrangement relationships between the capacitors C21 to C2n and the switch circuits SW21 to SW2n (not shown) are also similar to that in FIG. 8, and therefore, a detailed description is omitted.

As shown in FIG. 8, the switch circuits SW11 to SW1n are disposed below the capacitors C11 to C1n in a cross-sectional view so as to overlap the capacitors C11 to C1n in a plan view. For example, the capacitors C11 to C1n and the switch circuits SW11 to SW1n in FIG. 7 correspond to the capacitors C1 to Cn and the switch circuits SW1 to SWn in FIG. 2. The capacitors C1 to Cn are configured of the metal layers M4 and M5 in the upper layers. On the other hand, the switch circuits SW1 to SWn are configured of the metal layers M1 and M2 in the layers below the metal layers M4 and M5, and transistors (diffusion layers, gate electrodes, etc.) formed on the substrate PSB. The switch circuits SW1 to SWn are disposed below the capacitors C1 to Cn.

Figure 9:
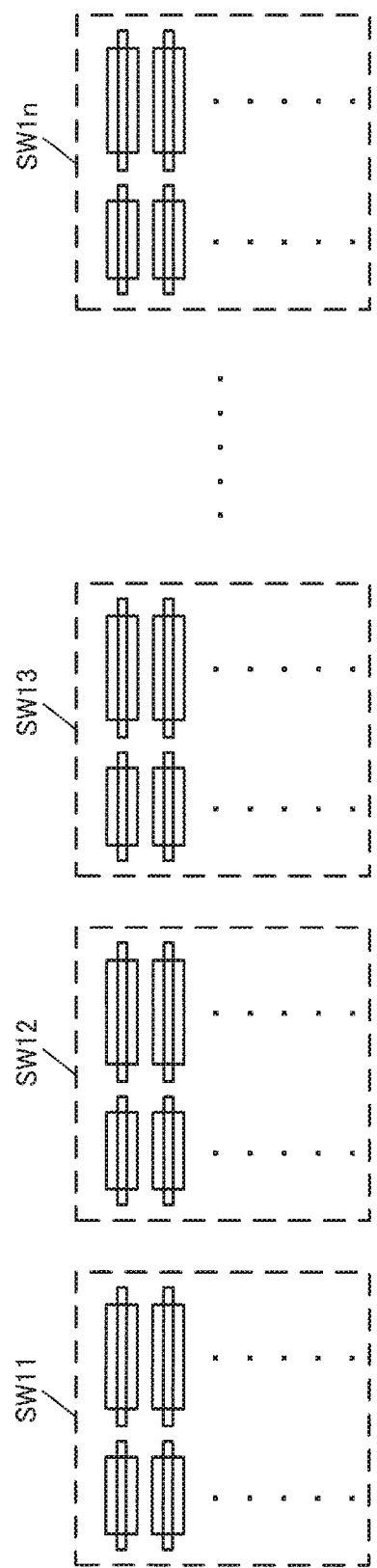
FIG. 9 is an explanatory view of the layout arrangement of the switch circuits.

FIG. 9 schematically shows the layout arrangement of the switch circuits SW11 to SW1n disposed below the capacitors C11 to C1n. As shown in FIG. 9, the transistors and the like constituting the switch circuits SW11 to SW1n are laid out and disposed in the same arrangement pattern. For example, the layout arrangement patterns of the transistors and the like of the switch circuits SW11 and SW12 are the same. The layout arrangement patterns of the transistors and the like of the switch circuits SW11 and SW13 to SW1n are also the same. The layout arrangement patterns of the switch circuits do not have to be completely the same. For example, it is sufficient that at least the arrangement patterns of the diffusion regions or gate electrodes constituting the transistors are the same. For example, the arrangement patterns of the contact layers or the metal layers may be different from each other. For example, when the logic level of a switch control signal is different between a first switch circuit and a second switch circuit, this difference is dealt with by differentiating the wiring patterns of the contact layers or the metal layers. The difference in the wiring patterns of the contact layers or the metal layers for such dealing is allowed.

For making the layout arrangement patterns of the switch circuits the same as in FIG. 9, dummy transistors that are originally unnecessary may be disposed. For example, it is assumed that the switch circuit of the first pattern in FIG. 3 requires the transfer gate and the P-type and N-type transistors while the switch circuit of the second pattern in FIG. 4 requires the transfer gate and only one of the P-type and N-type transistors. Also in this case, in the switch circuit of the second pattern in FIG. 4, it is desired to dispose the other transistor, which is originally unnecessary, as a dummy transistor for making the layout arrangement patterns of the switch circuits the same.

In this manner, by making the layout arrangement patterns of the switch circuits disposed below the capacitors the same (substantially the same), the degrees of deterioration of flatness of the capacitors caused by the arrangement of the switch circuits can be made uniform. Thus, capacitance relative accuracy of the capacitors in the capacitor array 20 can be improved, and an improvement in circuit performance can be achieved.

In the capacitor circuit 10 of the embodiment as described above, the switch circuits of the switch array 30 are disposed below the capacitors of the capacitor array 20 in the cross-sectional view so as to overlap the capacitors in the plan view. In addition, the switch control signal lines of the switch circuits are wired between the capacitor array 20 and the switch array 30 in the cross-sectional view.

For example, as a method of a comparative example of the embodiment, a method is considered in which the arrangement region of the switch array 30 is provided in a region different from the arrangement region of the capacitor array 20 in a plan view. In the method of the comparative example, however, the arrangement region of the switch array 30 is separately required in addition to the arrangement region of the capacitor array 20; therefore, the layout area of the capacitor circuit 10 is, for example, approximately doubled.

In contrast, in the embodiment, the arrangement region of the capacitor array 20 and the arrangement region of the switch array 30 are provided so as to overlap each other in the plan view as shown in FIG. 8. Thus, the arrangement region of the switch array 30 does not need to be provided in a region different from the arrangement region of the capacitor array 20 in the plan view. As a result of this, compared to the above method of the comparative example, the layout area of the capacitor circuit 10 can be reduced to, for example, approximately ½.

The switch control signal lines in the embodiment are wired between the capacitor array 20 and the switch array 30 in the cross-sectional view. Thus, also the wiring region of the switch control signal lines can be provided so as to overlap the arrangement region of the capacitor array 20 or the switch array 30 in the plan view. Thus, the wiring region of the switch control signal lines does not need to be provided in a region different from the arrangement regions of the capacitor array 20 and the switch array 30 in the plan view, and the layout area of the capacitor circuit 10 can be further reduced.

For example, elements such as transistors have not been disposed below the capacitors of the capacitor array 20 in the past. This is because, it was considered that, for example, when elements such as transistors were disposed below the capacitors, the flatness of the capacitors was deteriorated because of the presence of the elements and thus the capacitance relative accuracy and the like of the capacitors were deteriorated.

In this regard, in the embodiment, by purposely disposing the elements such as transistors of the switch circuits below the capacitors of the capacitor array 20, a reduction in the layout area of the capacitor circuit 10 is achieved as described above. In addition, by making the wiring patterns of the switch control signal lines and the like below the capacitors the same (substantially the same) as described with reference to FIG. 7, the uniformity of flatness of the capacitors is achieved. That is, even if the flatness of the capacitors is deteriorated because of the presence of the switch control signal lines below the capacitors, the degrees of deterioration of flatness are made uniform. As a result, therefore, the capacitance relative accuracy of the capacitors can be maintained. Further, also by making the layout arrangement patterns of the transistors of the switch circuits formed below the capacitors the same (substantially the same) as shown in FIG. 9, the uniformity of flatness of the capacitors is achieved, and the deterioration of the capacitance relative accuracy caused by the deterioration of flatness is suppressed. Thus, according to the embodiment, it is possible to provide the capacitor circuit 10, which can realize both the small area and high performance of a circuit.

2. Circuit Device

Next, an example of a circuit device 40 using the capacitor circuit 10 of the embodiment will be described. For example, FIG. 10 shows a configuration example of a successive approximation type A/D conversion circuit as one example of the circuit device 40 of an embodiment. The circuit device 40 includes capacitor circuits (CAR1, SAR1, CAR2, SAR2) and a control circuit 50 (processing unit or logic unit) that outputs switch control signals (SC1, SC2). For example, the circuit device 40 (A/D conversion circuit) includes a comparator circuit CP (comparator) connected at a comparison node NC (sampling node) with the capacitor arrays (CAR1, CAR2), a D/A conversion circuit 42 (DAC1, DAC2) including the capacitor arrays (CAR1, CAR2) and the switch arrays (SAR1, SAR2) and performing charge redistribution type D/A conversion, and the control circuit 50. The control circuit 50 generates the switch control signals (SC1, SC2) based on a comparison result (CPQ) of the comparator circuit CP, and outputs the switch control signals (SC1, SC2) to the switch arrays (SAR1, SAR2).

Specifically, the D/A conversion circuit 42 includes the D/A converter DAC1 on the MSB side (high-order bit side) and the D/A converter DAC2 on the LSB side (low-order bit side). Moreover, the D/A conversion circuit 42 may include a sub-D/A converter SDAC. The D/A converter DAC1 on the MSB side includes the capacitor array CAR1 and the switch array SAR1. The D/A converter DAC2 on the LSB side includes the capacitor array CAR2 and the switch array SAR2. The capacitor array CAR1 and the switch array SAR1, or the capacitor array CAR2 and the switch array SAR2, constitute the capacitor circuit 10 of the embodiment described with reference to FIGS. 1 to 9. For example, the other ends of the capacitor arrays CAR1 and CAR2 are connected to the comparison node NC. The comparison node NC is connected to an inverting input terminal (first terminal) of the comparator circuit CP, and a non-inverting input terminal (second terminal) of the comparator circuit CP is set to GND (reference voltage). One ends of the capacitor arrays CAR1 and CAR2 are respectively connected to the switch arrays SAR1 and SAR2. The switch arrays SAR1 and SAR2 are respectively switch-controlled by the switch control signals SC1 and SC2 from the control circuit 50.

The sub-D/A converter SDAC is a D/A converter for various kinds of adjustments and includes a capacitor array SCAR and a switch array SSAR. The other end of the capacitor array SCAR is connected to the comparison node NC, and one end of the capacitor array SCAR is connected to the switch array SSAR. The switch array SSAR is switch-controlled by a switch control signal SC3 from the control circuit 50. A trimming adjustment in capacitance variations or processing such as code shift can be realized by the sub-D/A converter SDAC.

The control circuit 50 performs various kinds of processing for successive approximation A/D conversion. Then, the control circuit 50 outputs the switch control signals SC1 and SC2 to the D/A converters DAC1 and DAC2. For example, the control circuit 50 includes a successive approximation register 52 whose register value is set by the comparison result signal CPQ from the comparator circuit CP, and generates data for successive approximation. The D/A conversion circuit 42 is a circuit that performs D/A conversion on the data for successive approximation. Specifically, the switch control signals SC1 and SC2 corresponding to the data for successive approximation are output from the control circuit 50. Then, the D/A converters DAC1 and DAC2 of the D/A conversion circuit 42 perform charge redistribution type D/A conversion based on the switch control signals SC1 and SC2.

The control circuit 50 in this case outputs the switch control signal SC1 through dynamic element matching (DEM) control to the D/A converter DAC1 on the MSB side. As the DEM control, for example a cyclic method can be employed. By performing the DEM control, randomness can be provided in the combination pattern of capacitors selected by the switch control signal (data for successive approximation) in the capacitor array, and apparent capacitance relative accuracy of the capacitors can be improved.

The voltage generating circuit 60 is provided in the circuit device 40 in FIG. 10. A resistor type DAC (resistor ladder type DAC or R2-R ladder type DAC) can be used as the voltage generating circuit 60. The voltage generating circuit 60 generates voltages V1 to V9 that are binary-weighted, and supplies the voltages V1 to V9 to the D/A converter DAC2 on the LSB side. For example, the voltage generating circuit 60 generates voltages such as V9=VDD/2, V8=VDD/4, V7=VDD/8, V6=VDD/16, . . . , and V1=VDD/512, and supplies the voltages to the D/A converter DAC2. The D/A converter DAC2 performs charge redistribution type D/A conversion using the voltages V1 to V9.

FIG. 11 is a detailed configuration example of the A/D conversion circuit as the circuit device 40 of the embodiment. The A/D conversion circuit performs 16-bit successive approximation A/D conversion. The 16-bit A/D conversion is realized by, for example, 7-bit charge redistribution type D/A conversion by the D/A converter DAC1 on the MSB side and 9-bit charge redistribution type D/A conversion by the D/A converter DAC2 on the LSB side.

The capacitor array CAR1 of the D/A converter DAC1 on the MSB side includes capacitors CA1 to CA128 whose other ends are connected to the comparison node NC. The capacitors CA1 to CA128 are unit capacitors (unit capacitances) each of which has a capacitance value of 1C. The switch array SAR1 includes switch circuits SA1 to SA128. One ends of the capacitors CA1 to CA128 are connected to one ends of the switch circuits SA1 to SA128. The input voltage VIN, the reference voltage VDD on the high-potential side, and the reference voltage GND on the low-potential side are supplied to the other ends of the switch circuits SA1 to SA128. The input voltage VIN is an input voltage to be subjected to A/D conversion. As the configuration of the switch circuits SA1 to SA128, for example the configuration of the switch circuit described with reference to FIG. 3 can be employed. The switch circuits SA1 to SA128 are switch-controlled by the switch control signal SC1 through DEM control.

The capacitor array CAR2 of the D/A converter DAC2 on the LSB side includes capacitors CB1 to CB9 whose other ends are connected to the comparison node NC. The capacitors CB1 to CB9 are unit capacitors each of which has a capacitance value of 1C. The switch array SAR2 includes switch circuits SB1 to SB9. One ends of the capacitors CB1 to CB9 are connected to one ends of the switch circuits SB1 to SB9. The voltages V1 to V9 from the voltage generating circuit 60 (resistor type DAC) and the reference voltage GND on the low-potential side are supplied to the other ends of the switch circuits SB1 to SB9. For example, the voltages V1 and GND are supplied to the switch circuit SB1, and the voltages V2 and GND are supplied to the switch circuit SB2. The same supplies to the other switch circuits SB3 to SB9. As the configuration of the switch circuits SB1 to SB9, for example the configuration of the switch circuit described with reference to FIG. 4 can be employed. In this case, the P-type transistors TP1 and TP2 supplied with VDD are originally unnecessary. However, the transistors TP1 and TP2 are laid out and disposed as dummy transistors not to be used, to achieve the uniformity of flatness of the capacitors by making the layout arrangements of the switch circuits substantially the same as described with reference to FIG. 8.

The operation of the circuit device 40 in FIG. 11 will be briefly described. In a sampling period of the input voltage VIN to be subjected to A/D conversion, the switch circuits SA1 to SA128 of the D/A converter DAC1 on the MSB side select the input voltage VIN. At this time, the switch circuits SB1 to SB9 on the LSB side select, for example, GND. With this configuration, the input voltage VIN is supplied to one ends of the capacitors CA1 to CA128, and charge corresponding to the input voltage VIN is stored in the capacitors. After the end of the sampling period, A/D conversion operation by successive approximation is performed.

In this case, the switch circuits SA1 to SA128 of the D/A converter DAC1 are switch-controlled by, for example, cyclic DEM control. For example, first, a DEM pointer is set to the position of the capacitor CA1. Then, 64 switch circuits SA1 to SA64 from the position of the pointer select VDD while the remaining 64 switch circuits SA65 to SA128 select GND. With this configuration, VDD is supplied to one ends of the capacitors CA1 to CA64, and GND is supplied to one ends of the capacitors CA65 to CA128. With this configuration, the comparator circuit CP can perform a comparison (MSB comparison) between the input voltage VIN and a voltage that is about ½ of the reference voltage VDD.

In the case where the comparison result signal CPQ of the comparator circuit CP is at H level (active level), the switch circuits SA65 to SA96 also select VDD while the switch circuits SA1 to SA64 keep selecting VDD. The remaining switch circuits SA97 to SA128 select GND. With this configuration, the comparator circuit CP can perform a comparison between the input voltage VIN and a voltage that is about ¾ of the reference voltage VDD.

On the other hand, in the case where the comparison result signal CPQ of the comparator circuit CP is at L level (inactive level) in the state where the switch circuits SA1 to SA64 select VDD, the switch circuits SA1 to SA32 select VDD while the remaining switch circuits SA33 to SA128 select GND. With this configuration, the comparator circuit CP can perform a comparison between the input voltage VIN and a voltage that is about ¼ of the reference voltage VDD.

In this manner, successive approximation A/D conversion is performed on the input voltage VIN. Then, the position of the last selected capacitor at the end of A/D conversion is stored as a pointer, and in the next A/D conversion, selection is performed from the position of the capacitor next to the pointer. For example, in the case where the switch circuits SA1 to SA40 select VDD while the switch circuits SA41 to SA128 select GND at the end of the cycle of A/D conversion, the position of the capacitor CA40 is stored as a pointer. Then, in the next cycle of A/D conversion, DEM control is performed with the position of the capacitor CA41, which is next to the capacitor CA40 indicated by the pointer, as a starting point.

On the other hand, the DEM control is not performed in the D/A converter DAC2 on the LSB side. The D/A converter DAC2 performs charge redistribution D/A conversion using the binary-weighted voltages V1 to V9 input to the switch circuits SB1 to SB9. By employing the configuration, high-resolution, high-accuracy A/D conversion can be realized without employing a configuration in which a series capacitor is provided between the D/A converter DAC1 and the D/A converter DAC2.

FIG. 12 shows a configuration example of the circuit device 40 as a fully differential A/D conversion circuit. In FIG. 12, the D/A converters DAC1P and DAC2P on the P-side (non-inverting side or positive side) and the D/A converters DAC1N and DAC2N on the N-side (inverting side or negative side) are provided.

The D/A converters DAC1P and DAC2P on the P-side are connected to a comparison node NCP on the non-inverting side, and the D/A converters DAC1N and DAC2N on the N-side are connected to a comparison node NCN on the inverting side. The non-inverting input terminal of the comparator circuit CP is connected to the comparison node NCP, and the inverting input terminal is connected to the comparison node NCN.

The D/A converter DAC1P on the P-side on the MSB side includes a capacitor array CAR1P including capacitors CA1P to CA128P and a switch array SAR1P including switch circuits SA1P to SA128P. The D/A converter DAC1N on the N-side on the MSB side includes a capacitor array CAR1N including capacitors CA1N to CA128N and a switch array SAR1N including switch circuits SA1N to SA128N.

When the switch circuits SA1P to SA128P on the P-side select VDD or GND, the switch circuits SA1P to SA128P on the N-side select GND or VDD as a voltage on the opposite side. That is, a logic circuit for performing logically inverting selection is provided in the switch circuits SA1P to SA128P and SA1N to SA128N.

The D/A converter DAC2P on the P-side on the LSB side includes a capacitor array CAR2P including capacitors CB1P to CB9P and a switch array SAR2P including switch circuits SB1P to SB9P. The D/A converter DAC2N on the N-side on the LSB side includes a capacitor array CAR2N including capacitors CB1N to CB9N and a switch array SAR2N including switch circuits SB1N to SB9N.

The switch circuits SB1P to SB9P on the P-side select voltages VN1 to VN9 from the voltage generating circuit 60 in FIG. 13 to be described later or GND. The switch circuits SB1N to SB9N on the N-side select voltages VP1 to VP9 from the voltage generating circuit 60 or VDD.

Next, the operation of the circuit device 40 in FIG. 12 will be briefly described. In a sampling period, switch circuits SIP and SIN respectively select an input voltage PIN on the P-side and an input voltage NIN on the N-side, and output the input voltages PIN and NIN to nodes NP and NN. In the sampling period, the switch circuits SA1P to SA128P select the input voltage PIN output to the node NP. The switch circuits SA1N to SA128N select the input voltage NIN output to the node NN. At this time, switch circuits SCMP and SCMN are turned on to set the comparison nodes NCP and NCN to a common voltage VCM. The switch circuits SB1P to SB9P on the LSB side select GND, and the switch circuits SB1N to SB9N select VDD. With this configuration, charges corresponding to the input voltages PIN and NIN are stored in the capacitors. The signal of the input voltage PIN and the signal of the input voltage NIN constitute a differential signal.

Next, in a conversion period, the switch circuits SCMP and SCMN are turned off to bring the comparison nodes NCP and NCN into a floating state, and successive approximation A/D conversion operation is performed based on data for successive approximation corresponding to the switch control signal. Specifically, the switch circuits SA1P to SA128P and SA1N to SA128N on the MSB side select VDD or GND in response to bits (switch control signal) on the MSB side (high-order bit side) of the data for successive approximation. When the switch circuits SA1P to SA128P on the P-side select VDD or GND, the switch circuits SA1N to SA128N on the N-side each select GND or VDD as a voltage on the opposite side. The switch circuits SB1P to SB9P on the P-side on the LSB side select VN1 to VN9 or GND in response to bits on the LSB side (low-order bit side) of the data for successive approximation. The switch circuits SB1N to SB9N on the N-side on the LSB side select VP1 to VP9 or VDD in response to bits on the LSB side of the data for successive approximation. The control circuit 50 in FIG. 10 successively obtains, by successive approximation, bits of A/D conversion data of the input voltages PIN and NIN based on the comparison result signal CPQ of the comparator circuit CP.

After the conversion period, the period moves to a reset period. In the reset period, the switch circuits SIP and SIN select the common voltage VCM, the nodes NP and NN are set to the common voltage VCM, the switch circuits SA1P to SA128P select the node NP, and the switch circuits SA1N to SA128N select the node NN. The switch circuits SCMP and SCMN also select the common voltage VCM. With this configuration, both ends of the capacitors CA1P to CA128P and the capacitors CA1N to CA128N are set to the common voltage VCM, and a reset operation for sampling capacitors is performed.

Figure 13:
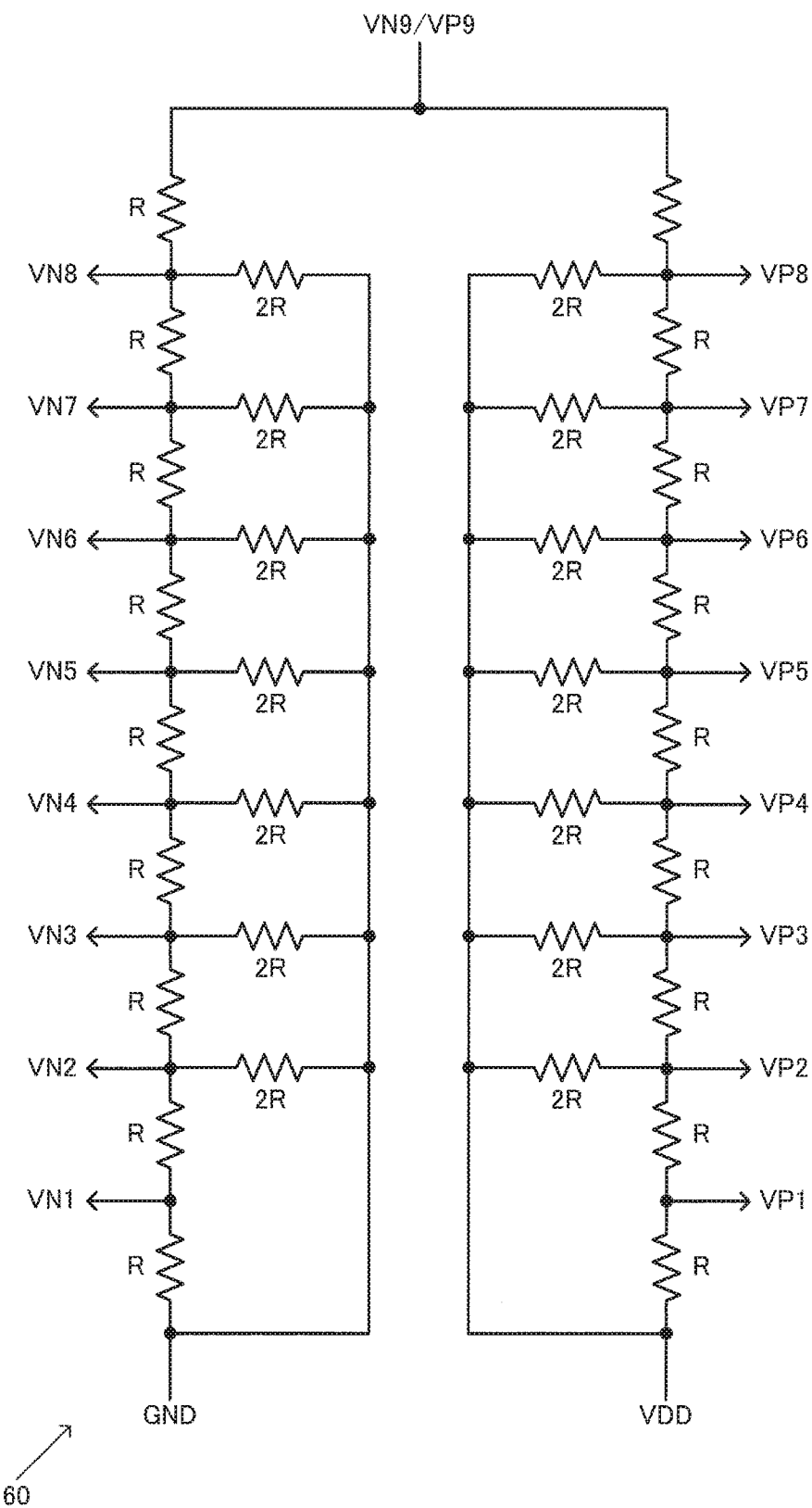
FIG. 13 shows a configuration example of a voltage generating circuit (resistor type DAC).

FIG. 13 is a configuration example of the voltage generating circuit 60. The voltage generating circuit 60 is a resistor type D/A converter that is configured of a ladder resistance circuit. The voltages VN9 and VP9 are intermediate voltages between VDD and GND. For example, when GND=0V, VN9=VP9=VDD/2. The voltage generating circuit 60 generates the voltages VN9 to VN1 binary-weighted between VN9 (=VDD/2) and GND (=0 V). For example, VN9=VDD/2, VN8=VDD/4, VN7=VDD/8, . . . , and VN1=VDD/512. Similarly, the voltage generating circuit 60 generates the voltages VP9 to VP1 binary-weighted between VP9 (=VDD/2) and VDD.

3. Layout Arrangement of Circuit Device

Figure 14:
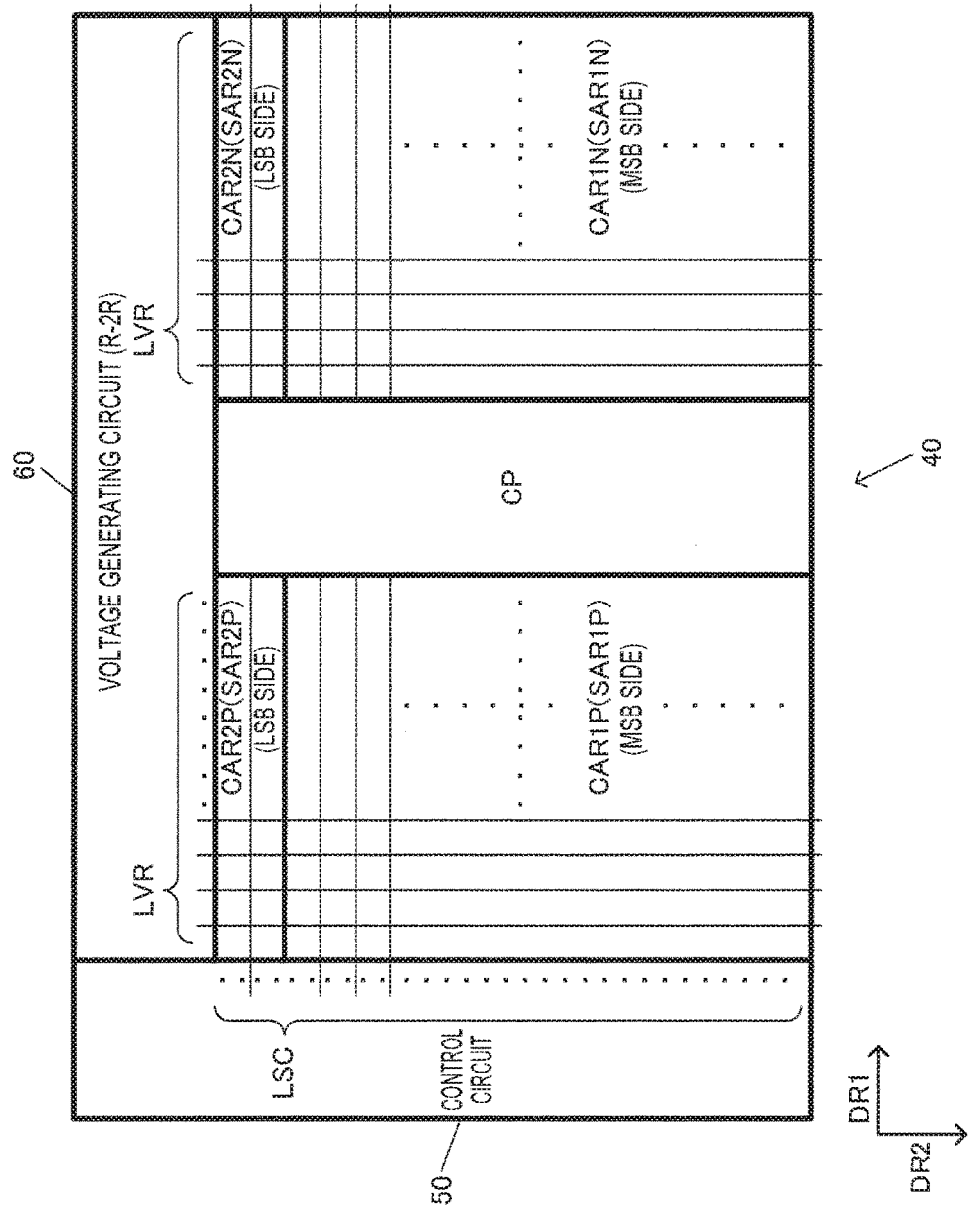
FIG. 14 shows a layout arrangement example of the circuit device of an embodiment.
Figure 15:
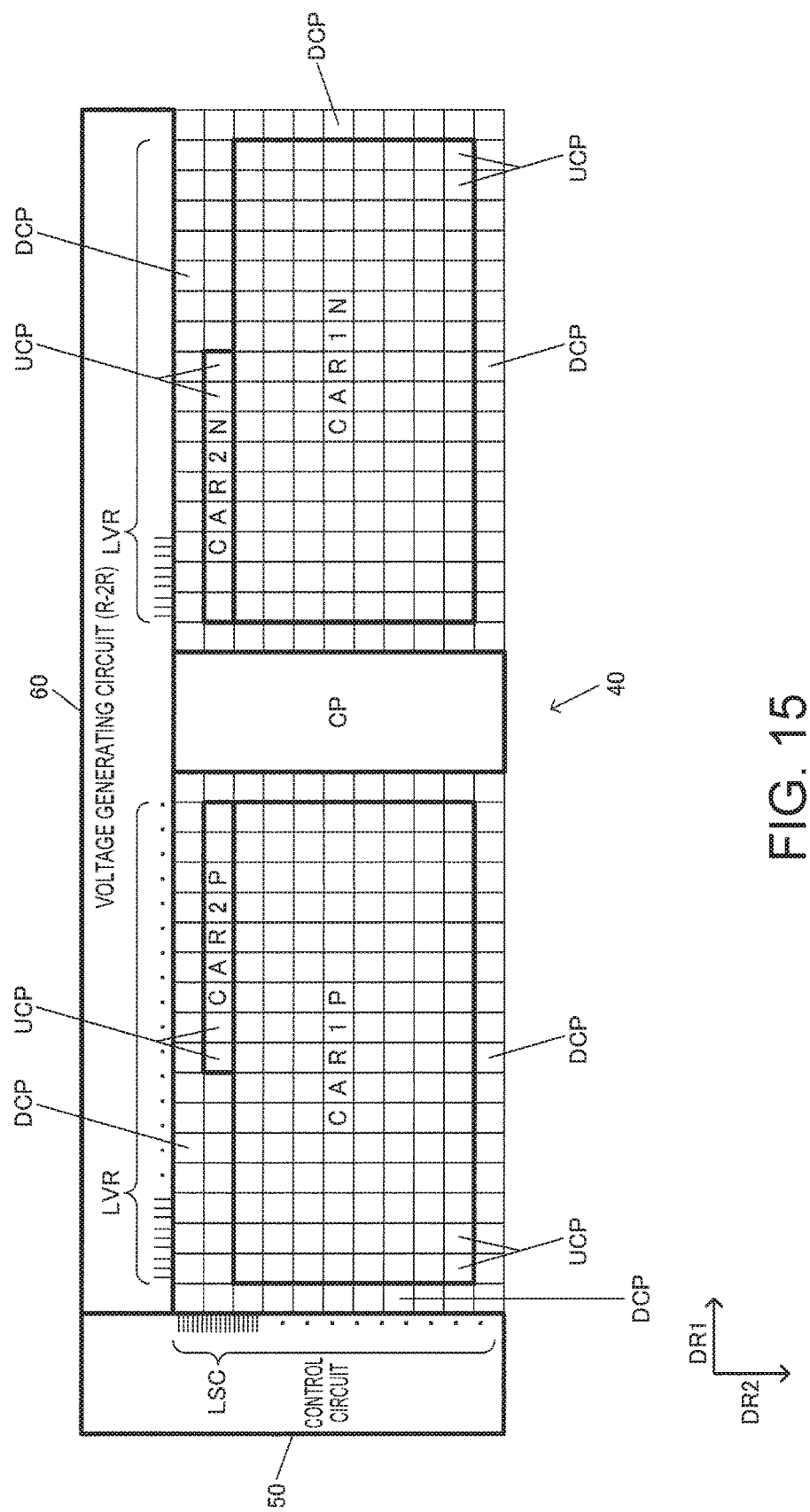
FIG. 15 shows a detailed layout arrangement example of the circuit device of an embodiment.

Next, a layout arrangement method of the circuit device 40 of an embodiment will be described. FIG. 14 shows a layout arrangement example of the circuit device 40 of the embodiment. FIG. 15 shows a detailed layout arrangement example thereof. In FIG. 14 and FIG. 15, the arrangements of the capacitor arrays, the switch arrays, the switch control signal lines, and the like are the arrangement configurations described with reference to FIGS. 1 to 9.

In a physical quantity detecting device (sensor) or the like, a high-resolution, high-performance, small-sized A/D conversion circuit is demanded. For example, in realizing the successive approximation type A/D conversion circuit using the charge redistribution type D/A conversion circuit shown in FIGS. 10 to 12, it is necessary to reduce the area of the capacitor array of the D/A conversion circuit. When the size of the unit capacitors (unit capacitances) constituting the capacitor array is reduced to reduce the area of the capacitor array, capacitance relative accuracy is deteriorated. For improving the capacitance relative accuracy, for example the DEM control method described with reference to FIG. 10 is used.

However, the use of the DEM control method requires switch circuits (analog switches) for all of the unit capacitors. For this reason, the area of the switch array configured of the switch circuits is increased, resulting in an increase in circuit area.

For suppressing the increase in circuit area, the switch circuits of the switch array are disposed below the capacitors (unit capacitors) of the capacitor array as described with reference to FIGS. 2 and 8 in the embodiment. For example, the transistors serving as the switch elements of the switch circuits or the transistors constituting the logic circuits are disposed. By doing so, since the arrangement region of the capacitor array and the arrangement region of the switch array are laid out and disposed so as to overlap each other in a plan view, the circuit area can be greatly reduced.

However, when the switch circuits are disposed below the capacitors as described above, the problem of a reduction in capacitance relative accuracy is caused due to the situation below the capacitors. For example, the flatness of the capacitors is deteriorated due to the situation below the capacitors, resulting in a decrease in capacitance relative accuracy.

In the embodiment, therefore, the method of wiring the switch control signal lines between the capacitor array and the switch array is employed as described with reference to FIG. 2. For example as in FIG. 7, by evenly and uniformly wiring the switch control signal lines between the capacitor array and the switch array, the uniformity of flatness of the capacitors can be achieved, and the capacitance relative accuracy can be improved. Moreover, by making the layout arrangements of the switch circuits disposed below the capacitors the same as in FIG. 9, the capacitance relative accuracy can be further improved. Moreover, by wiring the switch control signal lines between the capacitor array and the switch array, the arrangement regions of the capacitor array and the switch array and the wiring region of the switch control signal lines are laid out and disposed so as to overlap each other in a plan view; therefore, the circuit area can be further reduced. Especially by wiring the switch control signal lines along the first direction and wiring the voltage supply lines along the second direction as in FIG. 7, more efficient layout wiring can be realized, and a further reduction in circuit area can be achieved.

In the embodiment, the layout arrangement method shown in FIGS. 14 and 15 is employed. For example, the circuit device 40 of the embodiment includes, as shown in FIG. 10, the capacitor circuit 10 described with reference to FIGS. 1 to 9 and the control circuit 50 outputting the switch control signals (SC1, SC2).

As shown in FIG. 14, the capacitor arrays CAR1P, CAR1N, CAR2P, and CAR2N are disposed on the first direction DR1 side of the control circuit 50 in a plan view when viewed in the direction crossing the substrate PSB (FIG. 2). The switch arrays SAR1P, SAR1N, SAR2P, and SAR2N are disposed below the capacitor arrays CAR1P, CAR1N, CAR2P, and CAR2N. Switch control signal lines LSC are wired from the control circuit 50 along the first direction DR1 in the plan view.

FIG. 14 shows a layout arrangement example of the fully differential A/D conversion circuit in FIG. 12. As shown in FIG. 12, CAR1P and CAR1N are capacitor arrays on the MSB side, and CAR2P and CAR2N are capacitor arrays on the LSB side. The switch control signal lines LSC correspond to the switch control signal lines LS11 to LS1n and LS21 to LS2n in FIG. 7, and are wired between the capacitor array and the switch array in the cross-sectional view as shown in FIG. 2. By doing so, the arrangement regions of the capacitor array and the switch array and the wiring region of the switch control signal lines overlap each other in the plan view, and a reduction in circuit area can be achieved. Moreover, by disposing the capacitor arrays on the first direction DR1 side of the control circuit 50 and wiring the switch control signal lines LSC from the control circuit 50 to the capacitor arrays, the switch control signal lines LSC from the control circuit 50 can be connected in a short path to the switch circuits below the capacitors. Thus, a more efficient layout arrangement can be realized, and a further reduction in circuit area can be achieved. Moreover, by disposing the control circuit 50 in the position, it is easy to evenly and uniformly wire the switch control signal lines LSC connected to the switch circuits, in the array as described with reference to FIG. 7. With this configuration, the density of the switch control signal lines in the array is made uniform, and the uniformity of flatness of the capacitors can be achieved; therefore, an improvement in capacitance relative accuracy or the like can be achieved.

In the following, the capacitor arrays CAR1P and CAR1N are appropriately described as the capacitor array CAR1, the capacitor arrays CAR2P and CAR2N are appropriately described as the capacitor array CAR2, the switch arrays SAR1P and SAR1N are appropriately described as the switch array SAR1, and the switch arrays SAR2P and SAR2N are appropriately described as the switch array SAR2.

As described with reference to FIGS. 10 and 13, the circuit device 40 includes the voltage generating circuit 60 generating the voltages V1 to V9 (VN1 to VN9, VP1 to VP9). The capacitor array includes the capacitor array CAR1 (CAR1P, CAR1N; first capacitor array) on the MSB side (high-order bit side) and the capacitor array CAR2 (CAR2P, CAR2N; second capacitor array) on the LSB side (low-order bit side). The switch array includes the switch array SAR1 (SAR1P, SAR1N; first switch array) connected to the capacitor array CAR1 and the switch array SAR2 (SAR2P, SAR2N; second switch array) connected to the capacitor array CAR2. As shown in FIGS. 11 and 12, the voltages V1 to V9 from the voltage generating circuit 60 are supplied to the switch circuits of the switch array SAR2.

By providing the voltage generating circuit 60, it is possible to realize a high-resolution, high-accuracy A/D conversion circuit while configuring not only the capacitor array CAR1 on the MSB side but also the capacitor array CAR2 on the LSB side using the unit capacitors (capacitances 1C). That is, the same reference voltages (VDD, GND) are used in the D/A converter DAC1 on the MSB side, whereas the binary-weighted reference voltages (V1 to V9) are used in the D/A converter DAC2 on the LSB side. By doing so, for example, it is possible to realize a high-resolution, high-accuracy A/D conversion circuit while using the same unit capacitors without providing a series capacitor between the D/A converters DAC1 and DAC2.

As shown in FIG. 14, the switch control signal lines LSC are wired along the first direction DR1 in the plan view. The capacitor array CAR2 (CAR2P, CAR2N) on the LSB side is disposed between the voltage generating circuit 60 and the capacitor array CAR1 (CAR1P, CAR1N) on the MSB side in the plan view. For example, when the direction crossing (orthogonal to) the first direction DR1 is defined as the second direction DR2, the capacitor arrays CAR2 on the LSB side are disposed, for example, so as to be next to each other on the second direction DR2 side of the voltage generating circuit 60. The capacitor arrays CAR1 on the MSB side are disposed, for example, so as to be next to each other on the second direction DR2 side of the capacitor arrays CAR2. A plurality of voltage supply lines LVR for supplying the voltages from the voltage generating circuit 60 to the switch circuits of the switch arrays SAR1 (SAR1P, SAR1N) and SAR2 (SAR2P, SAR2N) are wired along the second direction DR2 in the plan view. For example, the voltage supply lines LVR (LV1 to LV9, LVDD, and LGND in FIG. 4) to the switch array SAR2 on the LSB side are wired from the upper end portion side (voltage generating circuit side) of the capacitor array along the second direction DR2 in FIG. 14. The voltage supply lines LVR (LVIN, LVDD, and LGND in FIG. 3) to the switch array SAR1 on the MSB side are wired from the lower end portion side of the capacitor array along the second direction DR2 (opposite direction in DR2).

By employing the arrangement configuration, the voltages (V1 to V9, VDD, GND) from the voltage generating circuit 60 can be supplied through the voltage supply lines in a short path to the switch circuits of the switch array SAR2 below the capacitor array CAR2 on the LSB side. Thus, a parasitic resistance of the voltage supply lines can be reduced, and an adverse effect of the parasitic resistance on the performance of the A/D conversion circuit can be minimized. Moreover, the voltage supply lines from the voltage generating circuit 60 to the switch array SAR2 on the LSB side are wired from the upper end portion side of the capacitor array and the voltage supply lines to the switch array SAR1 on the MSB side are wired from the lower end portion of the capacitor array, so that the voltage supply lines can be wired using the same metal layer (M2 in FIG. 2). With this configuration, efficient layout wiring is possible, and a reduction in circuit area can be achieved.

Moreover, by wiring the switch control signal lines using a given metal layer (e.g., M3 in FIG. 2) along the first direction DR1 and wiring the voltage supply lines using a metal layer (e.g., M2 in FIG. 2) in a layer different from the switch control signal lines along the second direction DR2, efficient layout wiring to the switch circuits of the switch array is possible. Moreover, for example as shown in FIG. 7, the switch control signal lines can be evenly and uniformly wired, beyond the connection points with the switch circuits, for example from the left end portion side to the right end portion side. With this configuration, the uniformity of flatness of the capacitors can be achieved, and an improvement in capacitance relative accuracy can be achieved. Moreover, the switch control signal lines can serve as shielded lines between the capacitor array and the switch array.

In the embodiment, the input voltage VIN to be subjected to A/D conversion, the reference voltage VDD on the high-potential side, and the reference voltage GND on the low-potential side are supplied, as shown in FIG. 3, to the switch circuits of the switch array SAR1 (first switch array) on the MSB side. The plurality of voltage supply lines for supplying the input voltage VIN, the reference voltage VDD on the high-potential side, and the reference voltage GND on the low-potential side to the switch circuits of the switch array SAR1 are wired along the second direction DR2 crossing the first direction DR1 in the plan view. By doing so, the voltage supply lines for VIN, VDD, and GND can be efficiently wired from the lower end portion side of the capacitor array to the switch array SAR1 (SAR1P, SAR1N) on the MSB side in FIG. 14, and efficient layout wiring is possible.

The circuit device of the embodiment includes the comparator circuit CP and the D/A conversion circuit 42 performing charge redistribution type D/A conversion as shown in FIG. 10 and the like. The control circuit 50 generates the switch control signals based on the comparison result of the comparator circuit CP, and outputs the switch control signals to the switch arrays. In the embodiment in this case, as shown in FIG. 14, the switch control signal lines (LSC) are wired along the first direction DR1 in the plan view, and the comparator circuit CP is disposed on the first direction DR1 side of the control circuit 50 in the plan view. Specifically in FIG. 14, the comparator circuit CP is disposed between the capacitor arrays CAR1P and CAR2P on the P-side (non-inverting side) and the capacitor arrays CAR1N and CAR2N on the N-side (inverting side). For example, the comparator circuit CP is disposed on the first direction DR1 side of the control circuit and on the second direction DR2 side of the voltage generating circuit 60. For example, the comparator circuit CP is disposed between the capacitor arrays CAR1P and CAR2P on the P-side (non-inverting side) and the capacitor arrays CAR1N and CAR2N on the N-side (inverting side).

By doing so, the control circuit 50, the comparator circuit CP, and the capacitor arrays can be efficiently laid out and disposed, and efficient signal layout wiring, a reduction in circuit area, or the like can be achieved.

FIG. 15 shows a detailed layout arrangement example of the circuit device 40 of an embodiment. The capacitor arrays CAR1P and CAR1N on the MSB side are each configured of a plurality of unit capacitors UCP disposed in an array (16×8 in FIG. 15). The capacitor arrays CAR2P and CAR2N on the LSB side are each configured of a plurality of unit capacitors UCP disposed in an array (9×1 in FIG. 15). Dummy capacitors DCP are disposed so as to surround the unit capacitors UCP. By disposing the dummy capacitors DCP, an improvement in capacitance relative accuracy can be achieved.

As described with reference to FIG. 8, switch circuits connected to the unit capacitors UCP are disposed below the unit capacitors UCP. As described with reference to FIG. 9, the arrangements of transistors and the like of the switch circuits below the unit capacitors UCP are the same (substantially the same) layout arrangement. For example as described with reference to FIG. 4 and the like, transistors that are originally unnecessary are disposed as dummy transistors, or the difference in logic level or the like is realized by changing the arrangement of contacts or the wiring lines of the metal layer. With this configuration, since the degrees of deterioration of flatness of the unit capacitors UCP caused by the switch circuits below the unit capacitors UCP can be made uniform, capacitance relative accuracy can be improved.

The circuit device 40 using the capacitor circuit 10 of the embodiment is not limited to the A/D conversion circuit shown in FIGS. 10 to 12, and various modifications can be implemented. For example, FIG. 16 shows an example in which the capacitor circuit 10 of the embodiment is used in the circuit device 40 for an oscillator.

Figure 16:
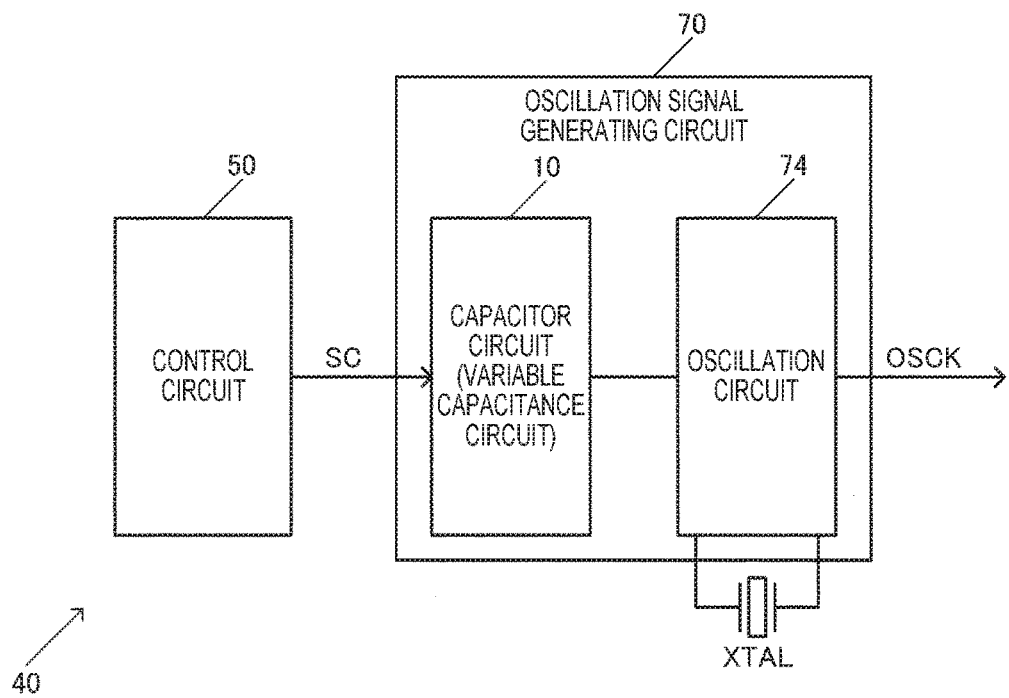
FIG. 16 shows another configuration example of the circuit device of an embodiment.

The circuit device 40 in FIG. 16 includes the control circuit 50 and an oscillation signal generating circuit 70. The control circuit 50 (processing unit) outputs a switch control signal SC (frequency control data) to the oscillation signal generating circuit 70. The oscillation signal generating circuit 70 generates an oscillation signal OSCK using the switch control signal SC from the control circuit 50 and a vibrator XTAL (oscillator element). For example, the circuit device 40 and the vibrator XTAL constitute an oscillator.

The vibrator XTAL is, for example, a quartz crystal vibrator or the like of a thickness-shear vibration type such as an AT-cut type or an SC-cut type, or a piezoelectric vibrator of a flexural vibration type or the like. The vibrator XTAL may be a resonator (electromechanical resonator or electrical resonant circuit). As the vibrator XTAL, a surface acoustic wave (SAW) resonator, a micro electromechanical systems (MEMS) vibrator as a silicon-based vibrator, or the like can be employed as a piezoelectric vibrator. As the substrate material of the vibrator XTAL, a piezoelectric single crystal such as quartz crystal, lithium tantalate, or lithium niobate, a piezoelectric material such as piezoelectric ceramics such as lead zirconate titanate, a silicon semiconductor material, or the like can be used.

The oscillation signal generating circuit 70 includes the capacitor circuit 10 and an oscillation circuit 74. The capacitor circuit 10 functions as a variable capacitance circuit, and the capacitance value thereof is controlled based on the switch control signal SC (frequency control data) from the control circuit 50. For example, one end of the capacitor circuit 10 as the variable capacitance circuit is connected to one end of the vibrator XTAL. The oscillation circuit 74 is connected to the vibrator XTAL via, for example, first and second terminals for vibrator (pads for vibrator). For example, the oscillation circuit 74 causes the vibrator XTAL (piezoelectric vibrator, resonator, etc.) to oscillate to thereby generate the oscillation signal OSCK.

The capacitor circuit 10 includes a capacitor array configured of a plurality of capacitors and a switch array configured of a plurality of switch circuits. The turning on or off of the plurality of switch circuits (switch elements) are controlled based on the switch control signal SC from the control circuit 50. The plurality of switch circuits are turned on or off to thereby vary the number of capacitors whose one ends are connected to one end of the vibrator XTAL, in the plurality of capacitors of the capacitor array. With this configuration, the capacitance value of the capacitor circuit 10 is controlled to thereby vary the capacitance value at one end of the vibrator XTAL. Thus, the capacitance value of the capacitor circuit 10 is directly controlled by the switch control signal (frequency control data), and the oscillation frequency of the oscillation signal OSCK can be controlled.

4. Physical Quantity Detecting Device, Electronic Apparatus, and Moving Object

Figure 17:
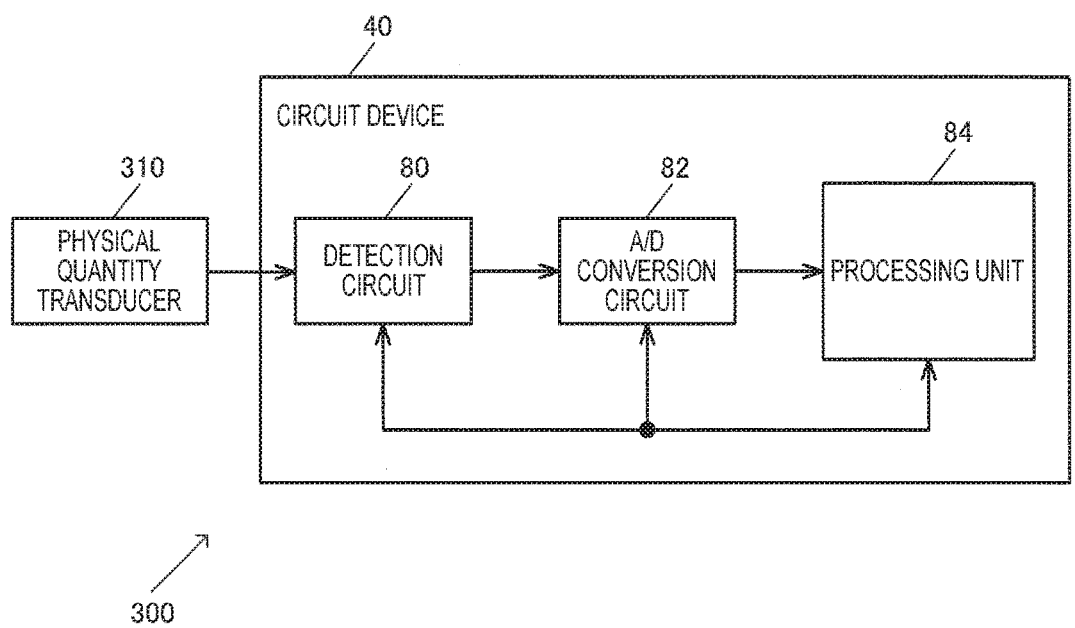
FIG. 17 shows a configuration example of a physical quantity detecting device.

FIG. 17 shows a configuration example of a physical quantity detecting device 300 of an embodiment. The physical quantity detecting device 300 includes a physical quantity transducer 310 and the circuit device 40 (IC) of the embodiment. The physical quantity transducer 310 and the circuit device 40 are mounted in, for example, a package of the physical quantity detecting device 300. The physical quantity detecting device 300 of the embodiment is not limited to the configuration in FIG. 17, and it is possible to implement various modifications such as omitting a portion of the components of the configuration or adding another component.

The physical quantity transducer 310 is, for example, an element (sensor) for detecting a physical quantity such as angular velocity or acceleration. The physical quantity transducer 310 is, for example, an angular velocity sensor (gyro sensor), which detects angular velocity about one or more axes. The angular velocity sensor may be a piezoelectric vibrating gyro or a capacitance detection type vibrating gyro formed of a silicon substrate or the like. As the piezoelectric vibrating gyro, for example a double T-shaped vibrator element or the like can be used. Alternatively, the physical quantity transducer 310 is, for example, an acceleration sensor, which detects acceleration in one or more axial directions. The physical quantity transducer 310 may be a transducer that detects a physical quantity other than angular velocity and acceleration (e.g., speed, travel distance, angular acceleration, pressure, etc.). Alternatively, the physical quantity transducer 310 may be a vibrator in an oscillator.

The circuit device 40 includes a detection circuit 80, an A/D conversion circuit 82, and a processing unit 84. The detection circuit 80 detects, based on a detection signal from the physical quantity transducer 310, a physical quantity signal corresponding to a physical quantity such as angular velocity or acceleration. In the case of taking an angular velocity sensor as an example, the detection circuit 80 includes an amplifier circuit (charge/voltage conversion circuit) that amplifies the detection signal from the physical quantity transducer 310 and a synchronous detector circuit. In this case, the circuit device 40 may include a driver circuit that drives the physical quantity transducer 310 (vibrator). The A/D conversion circuit 82 performs A/D conversion of an analog voltage (voltage of a desired signal) detected by the detection circuit 80. As the A/D conversion circuit 82, for example the circuit having the configuration described with reference to FIGS. 10 to 12 can be used. The processing unit 84 performs various kinds of processing based on detection data subjected to A/D conversion by the A/D conversion circuit 82. For example, the processing unit 84 performs various kinds of correction processing, filter processing (digital filter processing), or the like. The processing unit 84 may act as the control circuit 50 in FIG. 10.

Figure 18:
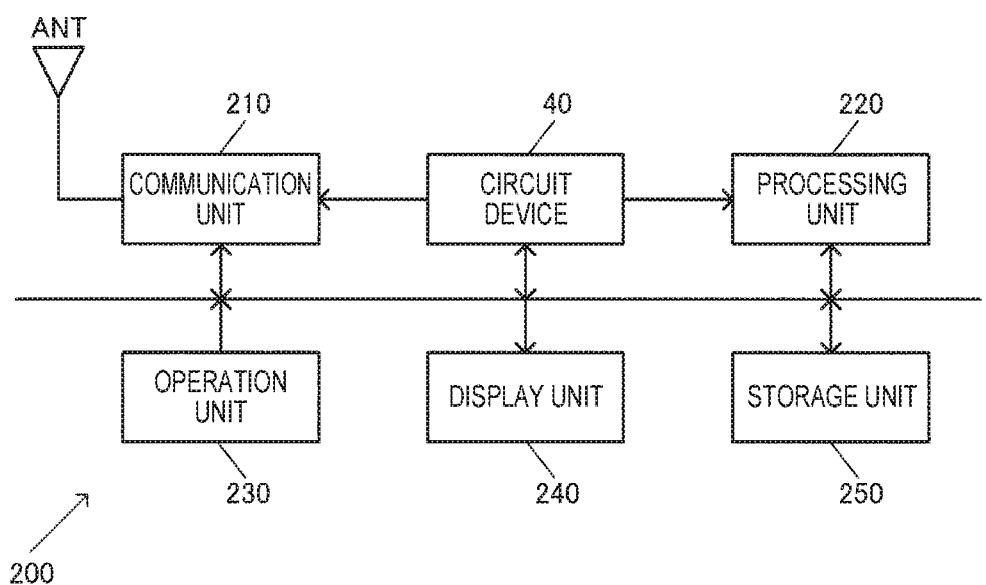
FIG. 18 shows an example of an electronic apparatus including the circuit device of an embodiment.

FIG. 18 shows a configuration example of an electronic apparatus 200 of an embodiment. The electronic apparatus 200 includes the circuit device 40 of the embodiment, a processing unit 220, and a storage unit 250. Moreover, the electronic apparatus 200 may include an antenna ANT, a communication unit 210, an operation unit 230, and a display unit 240. The electronic apparatus 200 of the embodiment is not limited to the configuration in FIG. 18, and it is possible to implement various modifications such as omitting a portion of the components of the configuration or adding another component.

As the electronic apparatus 200 of the embodiment, various types of apparatuses are conceivable, such as, for example, a digital camera (a digital still camera or a video camcorder), a biological information detecting device (a pulsimeter, an activity meter, a pedometer, a health watch, etc.), a head-mounted display device, a robot, a watch with built-in GPS, a car navigation system, a gaming device, various types of wearable apparatuses, a personal digital assistant (a smartphone, a mobile phone, a mobile gaming device, a tablet PC, etc.), a content providing terminal that distributes a content, a video apparatus, an audio apparatus, or a network-related apparatus (a base station, a router, etc.). For example, in a digital camera, camera-shake correction or the like using a gyro sensor or an acceleration sensor can be realized by the use of the circuit device of the embodiment. In a biological information detecting device, detection of user's body motion or detection of an exercise state using a gyro sensor or an acceleration sensor can be realized by the use of the circuit device of the embodiment. In a robot, the circuit device of the embodiment can be used in the movable portion (an arm or a joint) or main body portion of the robot. As a robot, both a moving object (a running or walking robot) and an electronic apparatus (a non-running or non-walking robot) are conceivable. In the case of a running or walking robot, the circuit device of the embodiment can be used for, for example, autonomous running. In a network-related apparatus, the circuit device of the embodiment can be used as, for example, a device that counts time of day (absolute time of day, etc.) or timing.

In FIG. 18, the communication unit 210 (radio circuit) performs processing such as receiving data from the outside via the antenna ANT or transmitting data to the outside. The processing unit 220 (processor), which is realized by a CPU, an MPU, or the like, performs various kinds of arithmetic processing, control processing of the electronic apparatus 200, and the like based on information stored in the storage unit 250 (memory). The operation unit 230 is a unit for the user to perform an input operation, and is realized by operation buttons, a touch panel display, or the like. The display unit 240 displays various kinds of information, and is realized by a liquid crystal display, an organic EL display, or the like. The storage unit 250 stores various kinds of information, and the function of the storage unit 250 can be realized by a semiconductor memory such as a RAM or a ROM, a hard disk drive (HDD), or the like.

Moreover, the circuit device of the embodiment can be built into, for example, various types of moving objects such as a car, an airplane, a motorcycle, a bicycle, or a ship. The moving object is, for example, an apparatus or device that includes a drive mechanism such as an engine or a motor, a steering mechanism such as a steering wheel or a helm, and various types of electronic apparatuses, and moves on the ground, through the sky, or at sea.

Figure 19:
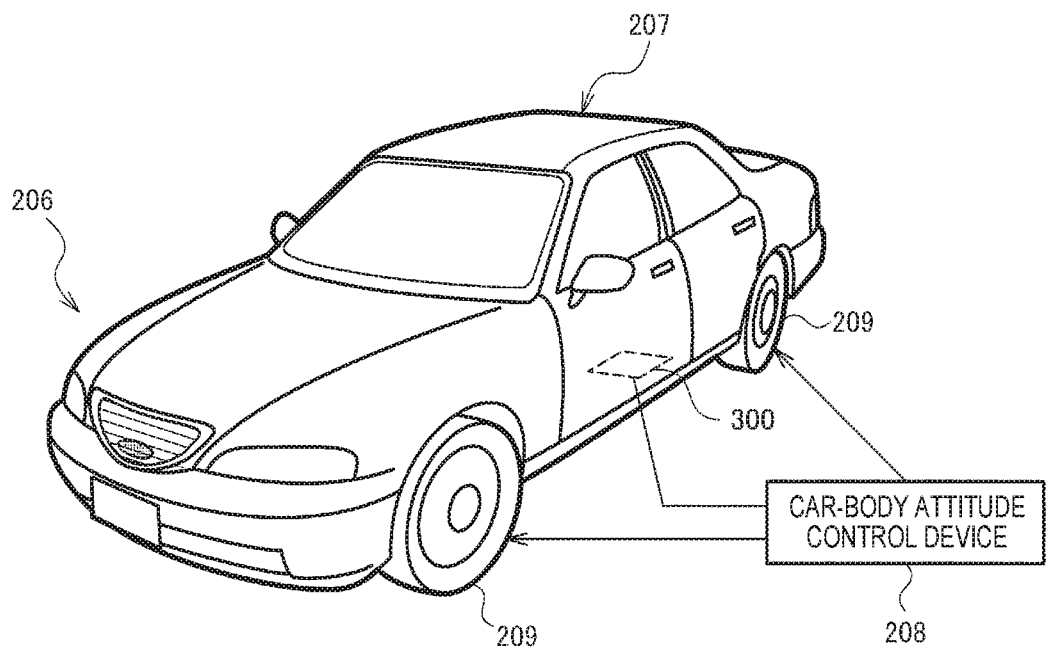
FIG. 19 shows an example of a moving object including the circuit device of an embodiment.

FIG. 19 schematically shows an automobile 206 as a specific example of a moving object. The physical quantity detecting device 300 including the physical quantity transducer and the circuit device is built into the automobile 206. The physical quantity detecting device 300 (e.g., a gyro sensor, a composite sensor that detects angular velocity and acceleration, etc.) can detect the attitude of a car body 207. A detection signal of the physical quantity detecting device 300 is supplied to a car-body attitude control device 208. The car-body attitude control device 208 can control, for example, the hardness or softness of a suspension according to the attitude of the car body 207, or control the braking of individual wheels 209. In addition, the attitude control can be used in various types of moving objects such as a bipedal walking robot, aircraft, and a helicopter. The physical quantity detecting device 300 (circuit device) is built into the moving object for realizing the attitude control.

The embodiments have been described in detail above; however, those skilled in the art would readily appreciate that many modifications are possible without substantially departing from the novel matters and advantageous effects of the invention. Thus, all of those modified examples are deemed to be included in the scope of the invention. For example, the terms (metal layer, etc.) mentioned in the specification or the drawings at least once together with different terms (conductive layer, etc.) in a broader sense or a similar sense may be replaced with the different terms in any part of the specification or the drawings. Moreover, the configurations and the like of the capacitor circuit, the circuit device, the physical quantity detecting device, the electronic apparatus, and the moving object are not limited to those described in the embodiments, and various modifications can be implemented.

The entire disclosure of Japanese Patent Application No. 2016-118443, filed Jun. 15, 2016 is expressly incorporated by reference herein.

What is claimed is:
1. A capacitor circuit comprising:
   a capacitor array including a plurality of capacitors;
   a switch array including a plurality of switch circuits, the plurality of switch circuits being respectively connected to the plurality of capacitors; a plurality of switch control signal lines supplied with a plurality of switch control signals for respectively performing switch-control of the plurality of switch circuits; and
   a substrate having a major surface on which the plurality of switch circuits are formed,
   wherein
   at least part of the plurality of capacitors is formed of a first conductive layer formed above the major surface of the substrate, the plurality of switch control signal lines are formed of a second conductive layer provided between the major surface of the substrate and the first conductive layer, and the capacitor array and the switch array are disposed so as to overlap each other at least in part in a plan view when viewed in a normal direction of the major surface of the substrate.

2. The capacitor circuit according to claim 1, wherein the plurality of switch control signal lines are wired along a first direction in the plan view.

3. The capacitor circuit according to claim 2, wherein the plurality of capacitors include first to n-th (n is an integer of 2 or more) capacitors disposed along the first direction in the plan view, the plurality of switch circuits include first to n-th switch circuits disposed along the first direction in the plan view, the plurality of switch control signal lines include first to n-th switch control signal lines for performing switch-control of the first to n-th switch circuits, an i-th (i is an integer of from 1 to n) capacitor of the first to n-th capacitors is connected to the i-th switch circuit of the first to n-th switch circuits, and the i-th switch control signal line of the first to n-th switch control signal lines is wired along the first direction so as to overlap the i-th capacitor of the first to n-th capacitors in the plan view.

4. The capacitor circuit according to claim 3, wherein the i-th switch control signal line of the first to n-th switch control signal lines is connected to the i-th switch circuit of the first to n-th switch circuits, and the first to n-th switch control signal lines are wired so as to overlap the first to n-th capacitors in the plan view.

5. The capacitor circuit according to claim 2, further comprising a plurality of voltage supply lines for supplying voltages to each of the plurality of switch circuits, wherein the plurality of voltage supply lines are wired along a second direction crossing the first direction so as to overlap the capacitor array in the plan view.

6. A circuit device comprising:
the capacitor circuit according to claim 1; and
a control circuit outputting the switch control signals.

7. A circuit device comprising:
the capacitor circuit according to claim 2; and
a control circuit outputting the switch control signals.

8. A circuit device comprising:
the capacitor circuit according to claim 3; and
a control circuit outputting the switch control signals.

9. The circuit device according to claim 7, wherein the capacitor array and the control circuit are disposed along the first direction in the plan view.

10. The circuit device according to claim 6, further comprising a voltage generating circuit generating voltages, wherein the capacitor array includes a first capacitor array and a second capacitor array, the switch array includes a first switch array connected to the first capacitor array and a second switch array connected to the second capacitor array, and the voltages from the voltage generating circuit are supplied to the switch circuits of the second switch array.

11. The circuit device according to claim 10, wherein the plurality of switch control signal lines are wired along a first direction in the plan view, the second capacitor array is disposed between the voltage generating circuit and the first capacitor array in the plan view, and a plurality of voltage supply lines for supplying the voltages from the voltage generating circuit to the switch circuits of the second switch array are wired along a second direction crossing the first direction in the plan view.

12. The circuit device according to claim 10, wherein the first capacitor array deals with high-order bit-side A/D conversion in A/D conversion, the second capacitor array deals with low-order bit-side A/D conversion in A/D conversion, an input voltage to be subjected to A/D conversion, a high-potential side reference voltage, and a low-potential side reference voltage are supplied to the switch circuits of the first switch array, and a plurality of voltage supply lines for supplying the input voltage, the high-potential side reference voltage, and the low-potential side reference voltage to the switch circuits of the first switch array are wired along a second direction crossing the first direction in the plan view.

13. The circuit device according to claim 6, further comprising:
a comparator circuit connected at a comparison node with the capacitor array; and
a D/A conversion circuit including the capacitor array and the switch array and performing charge redistribution type D/A conversion, wherein
the control circuit generates the switch control signals based on a comparison result of the comparator circuit, and outputs the switch control signals to the switch array.

14. The circuit device according to claim 13, wherein the plurality of switch control signal lines are wired along a first direction in a plan view when viewed in a direction crossing the substrate, and the comparator circuit and the control circuit are disposed along the first direction in the plan view.

15. A physical quantity detecting device comprising:
a physical quantity transducer; and
the circuit device according to claim 6, which detects a physical quantity based on a detection signal from the physical quantity transducer.

16. A physical quantity detecting device comprising:
a physical quantity transducer; and
the circuit device according to claim 9, which detects a physical quantity based on a detection signal from the physical quantity transducer.

17. An electronic apparatus comprising the circuit device according to claim 6.

18. An electronic apparatus comprising the circuit device according to claim 9.

19. A moving object comprising the circuit device according to claim 6.

20. A moving object comprising the circuit device according to claim 9.

* * * * *